US011217518B2

(12) United States Patent
Lee et al.

(10) Patent No.: US 11,217,518 B2
(45) Date of Patent: Jan. 4, 2022

(54) PACKAGE STRUCTURE AND METHOD OF FORMING THE SAME

(71) Applicant: Taiwan Semiconductor Manufacturing Co., Ltd., Hsinchu (TW)

(72) Inventors: Tzung-Hui Lee, New Taipei (TW); Hung-Jui Kuo, Hsinchu (TW); Ming-Che Ho, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/714,819

(22) Filed: Dec. 16, 2019

(65) Prior Publication Data

US 2020/0118914 A1  Apr. 16, 2020

Related U.S. Application Data

(63) Continuation of application No. 15/905,756, filed on Feb. 26, 2018, now Pat. No. 10,510,646.

(51) Int. Cl.
  *H01L 23/498* (2006.01)
  *H01L 25/11* (2006.01)
  *H01L 23/31* (2006.01)
  *H01L 21/48* (2006.01)

(52) U.S. Cl.
  CPC .... *H01L 23/49822* (2013.01); *H01L 21/4857* (2013.01); *H01L 23/3107* (2013.01); *H01L 23/49827* (2013.01); *H01L 23/49838* (2013.01); *H01L 25/117* (2013.01)

(58) Field of Classification Search
  None
  See application file for complete search history.

(56) References Cited

U.S. PATENT DOCUMENTS

| | | | |
|---|---|---|---|
| 7,294,544 B1 * | 11/2007 | Ho | H01L 21/8221 257/296 |
| 7,405,149 B1 * | 7/2008 | Lin | H01L 21/768 257/E21.004 |
| 8,368,204 B2 * | 2/2013 | Lin | H01L 23/60 257/700 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,874 B2 | 6/2015 | Edelstein et al. | |
| 9,111,949 B2 | 8/2015 | Yu et al. | |
| 9,263,511 B2 * | 2/2016 | Yu | H01L 21/565 |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 10,170,430 B2 * | 1/2019 | Chiu | H01L 21/4853 |

* cited by examiner

*Primary Examiner* — Long Pham
(74) *Attorney, Agent, or Firm* — JCIPRNET

(57) ABSTRACT

A package structure and a method of forming the same are provided. The package structure includes a die, an encapsulant, a dielectric layer, a first redistribution layer (RDL) and a second RDL. The encapsulant laterally encapsulates the die. The dielectric layer is located on the encapsulant and the die. The first RDL penetrates through the dielectric layer to connect to the die. The second RDL is located on the first RDL and the dielectric layer. The second RDL and the first RDL share a common seed layer.

20 Claims, 22 Drawing Sheets

PACKAGE STRUCTURE AND METHOD OF FORMING THE SAME

CROSS-REFERENCE TO RELATED APPLICATION

This application is a continuation application of and claims the priority benefit of a prior application Ser. No. 15/905,756, filed on Feb. 26, 2018, now allowed. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness. In the integrated fan-out packages, the formation of the redistribution circuit structure plays an important role during packaging process.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
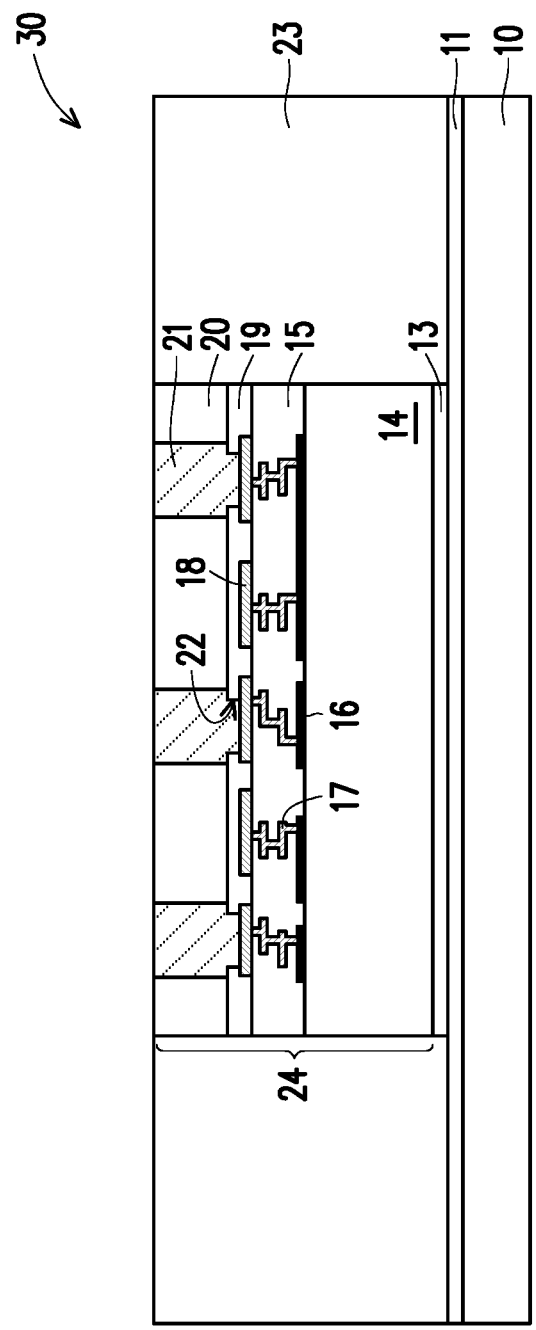
FIG. 1 is a schematic cross-sectional view illustrating a structure before a redistribution layer (RDL) structure is formed.

The following disclosure provides different embodiments, or examples, for implementing different features of the provided subject matter. Specific examples of the components and configurations are described below to simplify the disclosure in a simplified manner. These are, of course, merely examples and are not intended to be limiting. For example, the formation of a second feature over or on a first feature, may include embodiments, in which the second feature is formed in direct contact with the first feature, and may also include embodiments, in which an additional feature may be formed between the second and the first features, such that the second feature may not be in direct contact with the first feature. In addition, the disclosure may reference numerals and/or letters in the various examples. The repetition is for the sake of simplicity and clarity, and does not dictate a relationship between the various embodiments and/or the configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the FIGS. The apparatus may be otherwise oriented (rotated 90 degrees or at other orientations) and the spatially relative descriptors used herein may likewise be interpreted accordingly.

FIG. 1 is a schematic cross-sectional view illustrating a structure before a redistribution layer (RDL) structure is formed.

Referring to FIG. 1, a structure 30 is provided. In some embodiments, the structure 30 includes a carrier 10, a die 24 and an encapsulant 23. The die 24 is, for example, one of a plurality of dies cut apart from a wafer. The die 24 may be an application-specific integrated circuit (ASIC) chip, an analog chip, a sensor chip, a wireless and radio frequency chip, a voltage regulator chip or a memory chip. In some embodiments, the die 24 includes a substrate 14, integrated circuit devices 16, an interconnect structure 17, a dielectric layer 15, a plurality of pads 18, a passivation layer 19, a plurality of connectors 21, and a passivation layer 20.

The substrate 14 is a semiconductor substrate such as a silicon substrate. The substrate 14 is, for example, a bulk silicon substrate, a doped silicon substrate, an undoped silicon substrate or a silicon-on-insulator (SOI) substrate. The dopant of the doped silicon substrate may be an N-type dopant, a P-type dopant, or a combination thereof. The substrate 14 may also be formed by other semiconductor materials. The other semiconductor materials include but are not limited to silicon germanium, silicon carbide, gallium arsenide, or the like. The substrate 14 includes active areas and isolation structures (not shown). The integrated circuit devices 16 are formed in the active areas of the substrate 14. The integrated circuit devices 16 are, for example, transistors, capacitors, resistors, diodes, photodiodes, fuse devices, or the like.

The dielectric layer 15 and the interconnect structure 17 are formed over the integrated circuit devices 16. The interconnect structure 17 is formed in the dielectric layer 15 and electrically connected to different integrated circuit devices 16 to form a functional circuit. In some embodiments, the dielectric layer 15 includes an inter-layer dielectric layer (ILD) and one or more inter-metal dielectric layers (IMDs). In some embodiments, the interconnect structure 17 includes multiple layers of metal lines and plugs. The metal lines and plugs include conductive materials. The plugs include contact plugs and via plugs. The contact plugs are located in the ILD to connect the metal lines and the integrated circuit devices 16. The via plugs are located in the IMD to connect the metal lines in different layers.

The pads 18 are formed on the interconnect structure 17. The pads 18 is electrically connected to the interconnect structure 17 to provide an external connection to the integrated circuit devices 16. In some embodiments, the pads 18 are referred as a portion of the interconnect structure 17. The material of the pads 18 may include metal or metal alloy such as copper, aluminum, nickel, or alloys thereof.

The passivation layer 19 is formed on the substrate 14 and covers a portion of the pads 18. The passivation layer 19 may be a single layer or a multi-layer structure. The passivation layer 19 includes an insulating material such as silicon oxide, silicon nitride, polymer, or a combination thereof. The polymer is, for example, polybenzoxazole (PBO), polyimide, benzocyclobutene (BCB), a combination thereof, or the like. The passivation layer 19 has a plurality of openings 22 exposing a portion of the pads 18.

The connectors 21 are formed over and electrically connected to the pads 18 exposed by the openings 22. The connectors 21 are electrically connected to the integrated circuit devices 16 through the pads 18 and the interconnect structure 17. The connectors 21 include solder bumps, gold bumps, copper bumps, copper posts, or the like. The term "copper posts" refers to copper protrusions, copper through vias, thick copper pads, and/or copper-containing protrusions. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum, or zirconium, etc. The connectors 21 are formed by, for example, physical vapor deposition (PVD) or electroplating.

The passivation layer 20 is formed on the passivation layer 19 and aside the connectors 21 to cover the sidewalls of the connectors 21. The material of the passivation layer 20 may be the same as or different from the material of the passivation layer 19. In some embodiments, the top surface of the passivation layer 20 is substantially level with the top surfaces of the connectors 21.

In some embodiments, an adhesive layer 13 is formed on the backside of the die 24 (i.e., the side away from the connectors 21). The adhesive layer 13 includes a die attach film (DAF), a silver paste, or the like.

The die 24 with the adhesive layer 13 is placed on a carrier 10. The carrier 10 is provided with a de-bonding layer 11 formed thereon. The adhesive layer 13 on the backside of the die 24 is attached to the de-bonding layer 11 on the carrier 10. The carrier 10 may be a blank glass carrier, a blank ceramic carrier, or the like. The de-bonding layer 11 may be formed of an adhesive, such as ultra-violet (UV) glue, light-to-heat conversion (LTHC) glue, or the like, or other types of adhesives. In some embodiments, the de-bonding layer 11 may be decomposed under the heat of light to release the carrier 10 from the structure 30 in subsequent processes.

The encapsulant 23 is formed over the carrier 10 to encapsulate the sidewalls of the die 24. In some embodiments, the encapsulant 23 includes a molding compound, a molding underfill, a resin such as epoxy, a combination thereof, or the like. In some embodiments, the encapsulant 23 includes a photo-sensitive material such as PBO, polyimide, BCB, a combination thereof, or the like, which may be easily patterned by exposure and development processes. In alternative embodiments, the encapsulant 23 includes nitride such as silicon nitride, oxide such as silicon oxide, phosphosilicate glass (PSG), borosilicate glass (BSG), boron-doped phosphosilicate glass (BPSG), a combination thereof, or the like. The encapsulant 23 is formed by forming an encapsulant material layer over the carrier 10 by a suitable fabrication technique such as spin coating, lamination, deposition, or similar processes. The encapsulant material layer encapsulates the top surfaces and sidewalls of the die 24. Thereafter, a grinding or polishing process is performed to remove a portion of the encapsulant material layer, such that the top surfaces of the connectors 21 are exposed.

Figure 2A:
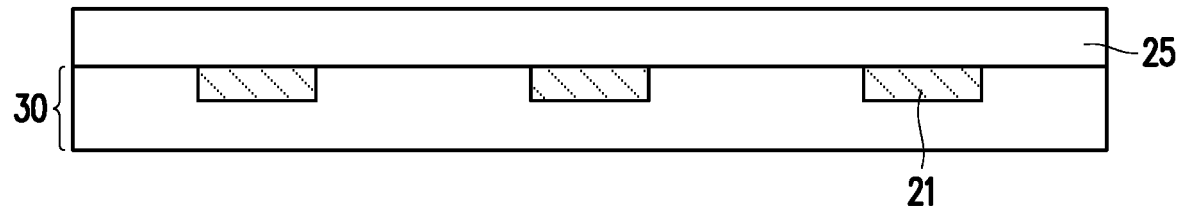
FIG. 2A to FIG. 2P are schematic cross-sectional views illustrating a method of forming a package structure according to a first embodiment of the disclosure.
Figure 2B:
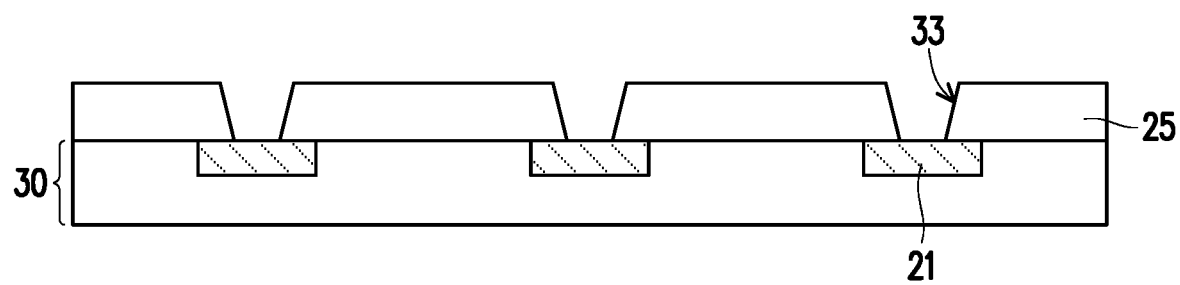
Figure 2C:
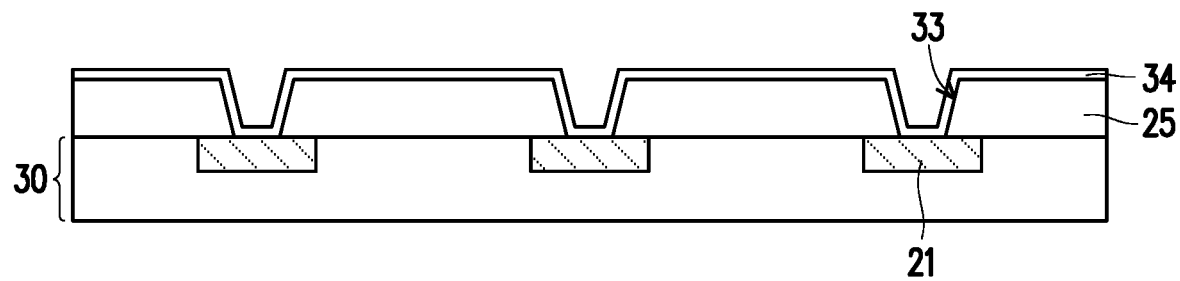
Figure 2D:
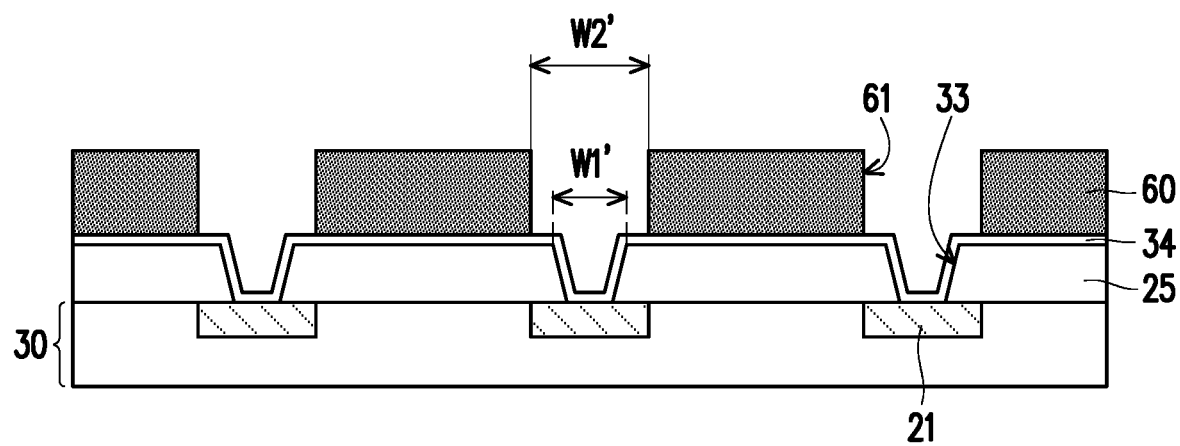
Figure 2E:
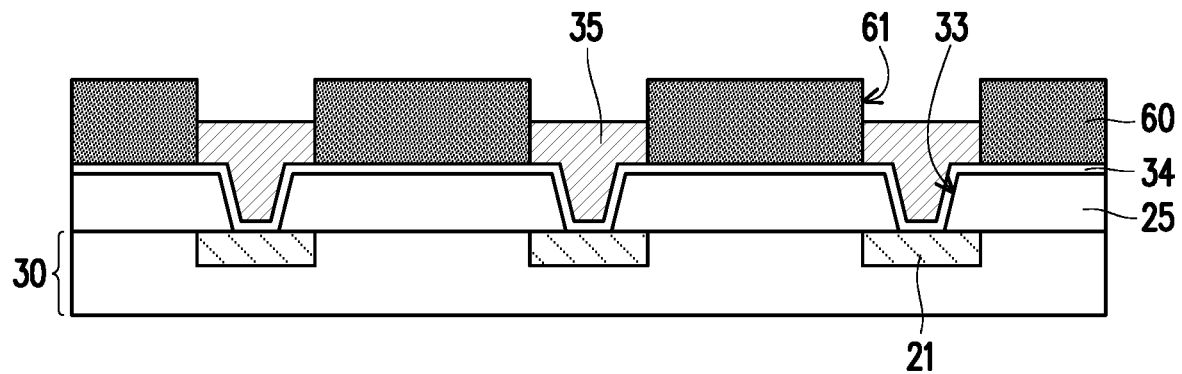
Figure 2F:
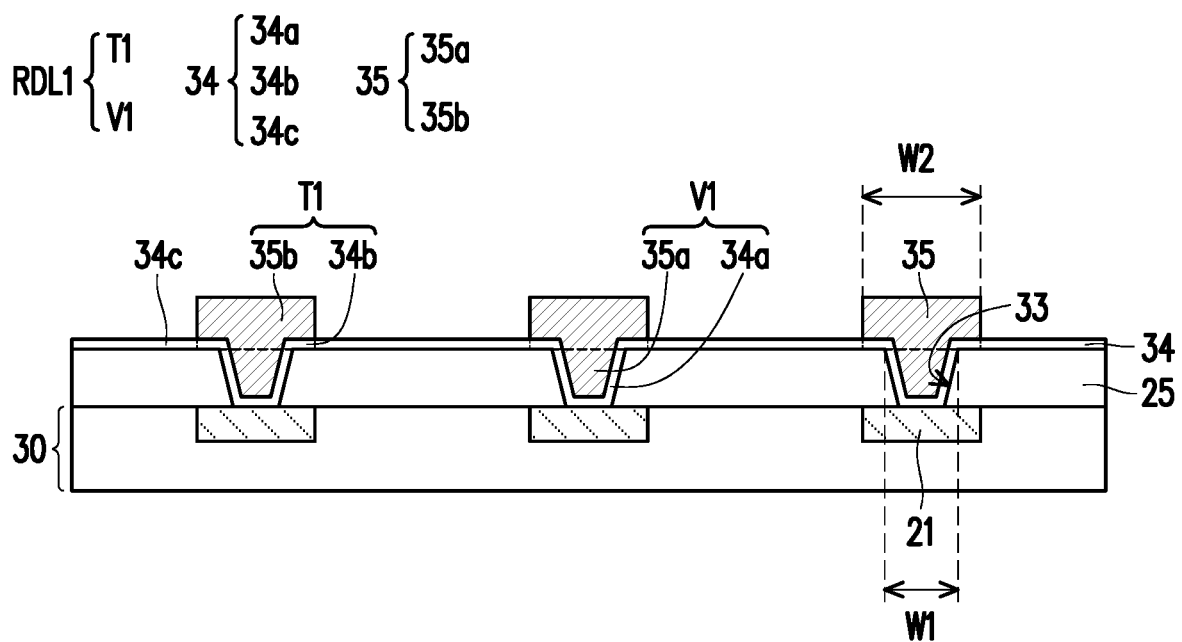
Figure 2G:
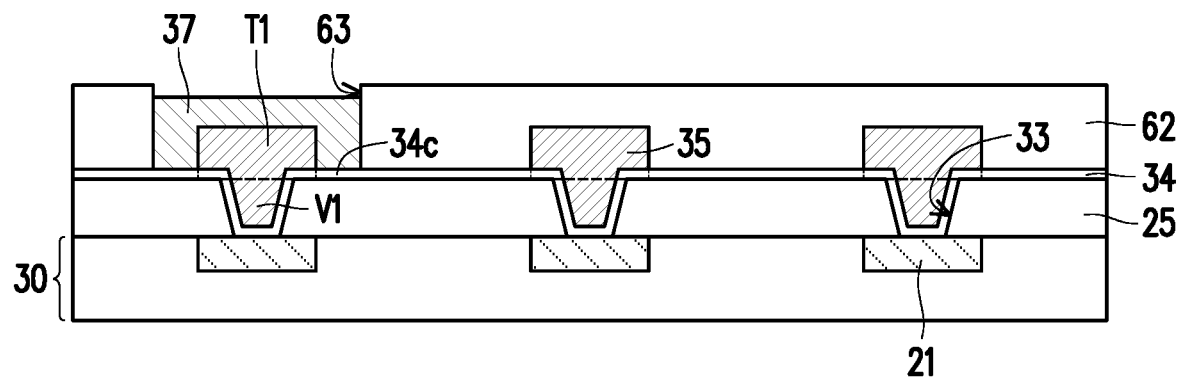
Figure 2H:
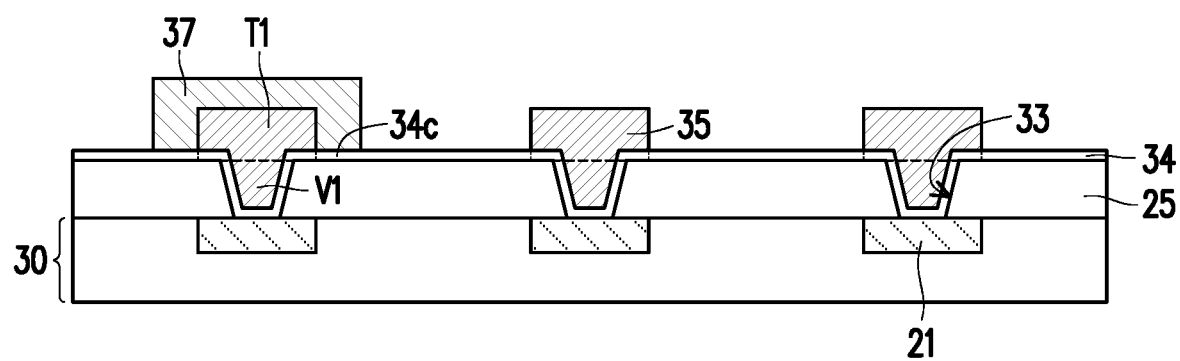
Figure 2I:
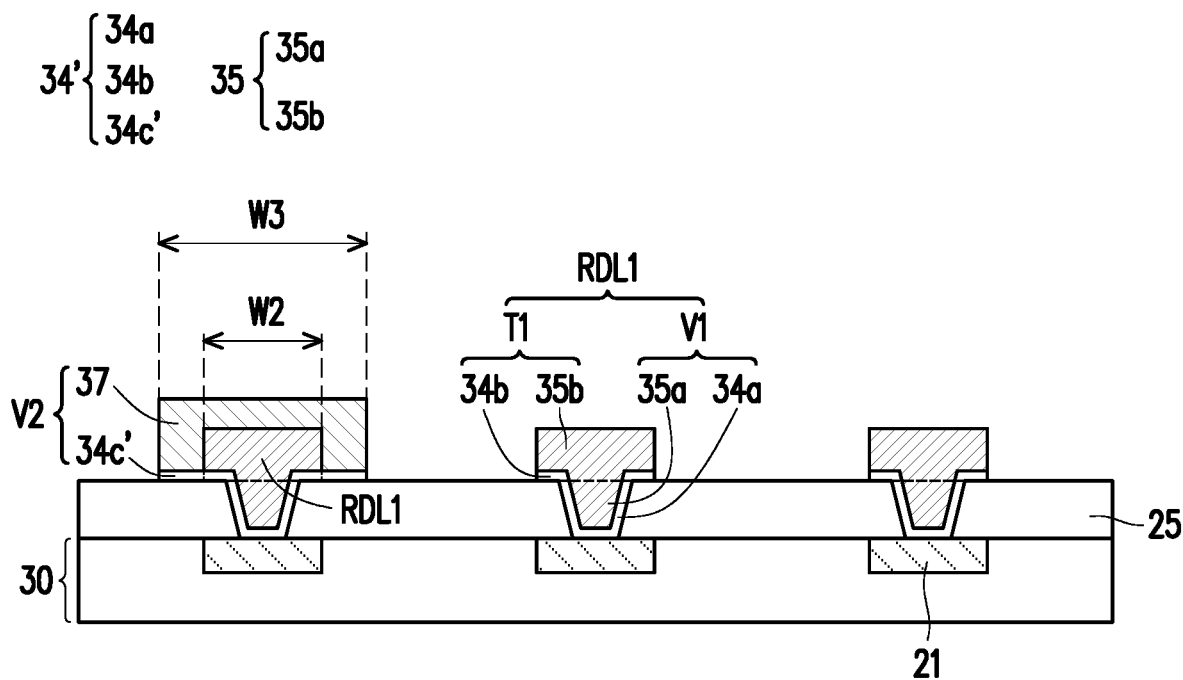
Figure 2J:
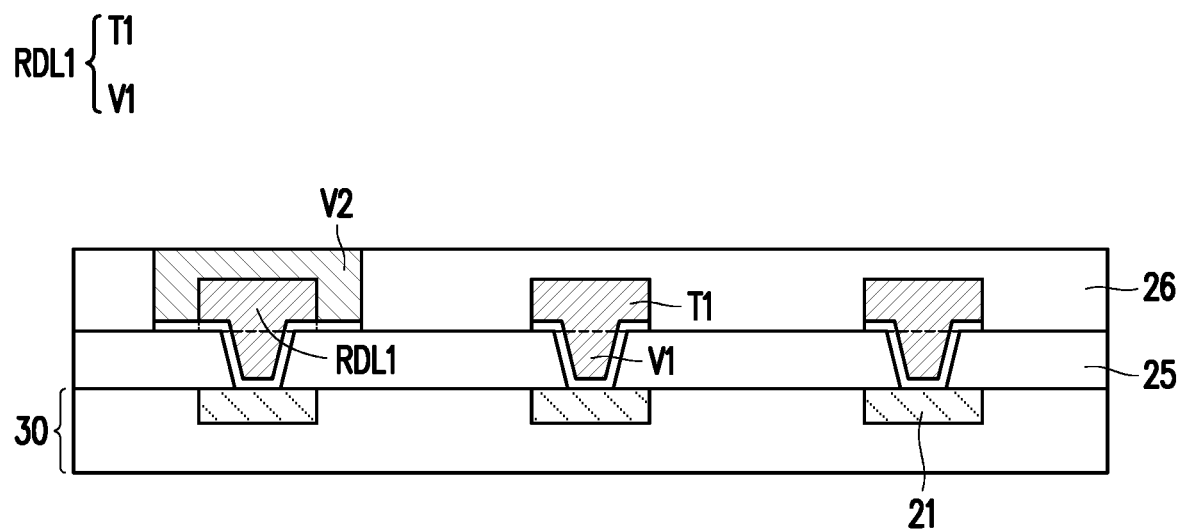
Figure 2K:
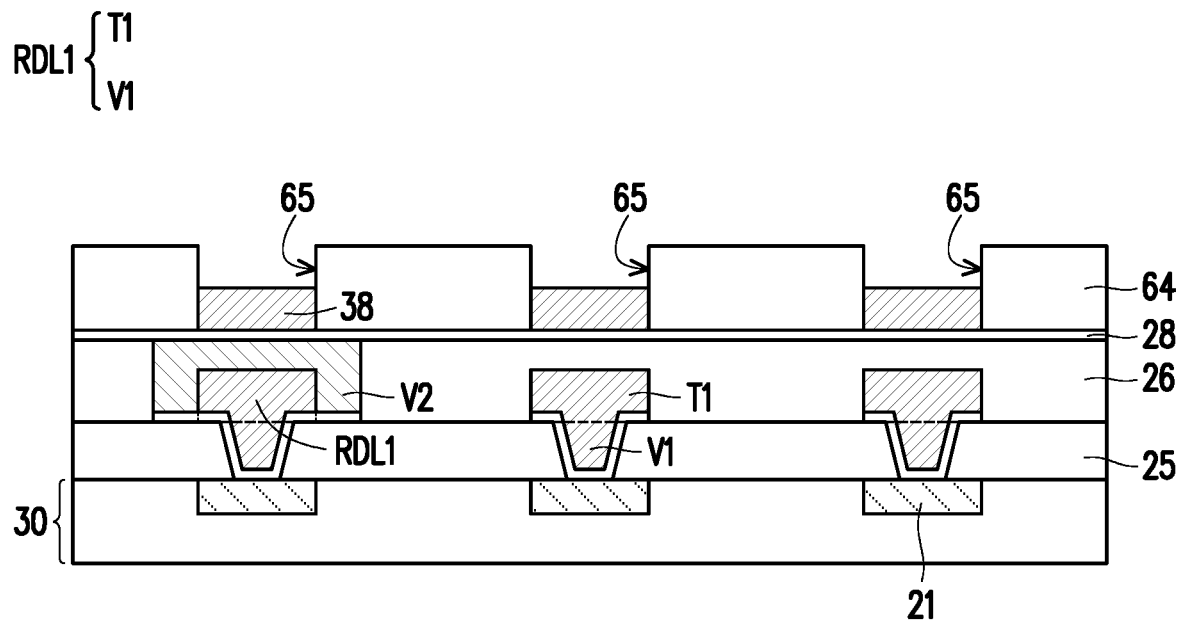
Figure 2L:
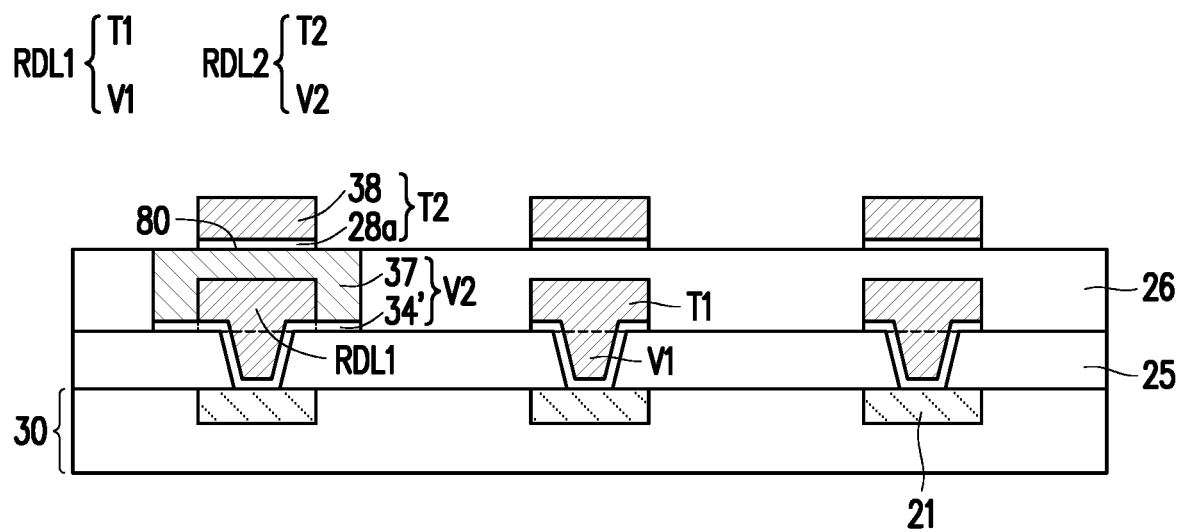
Figure 2M:
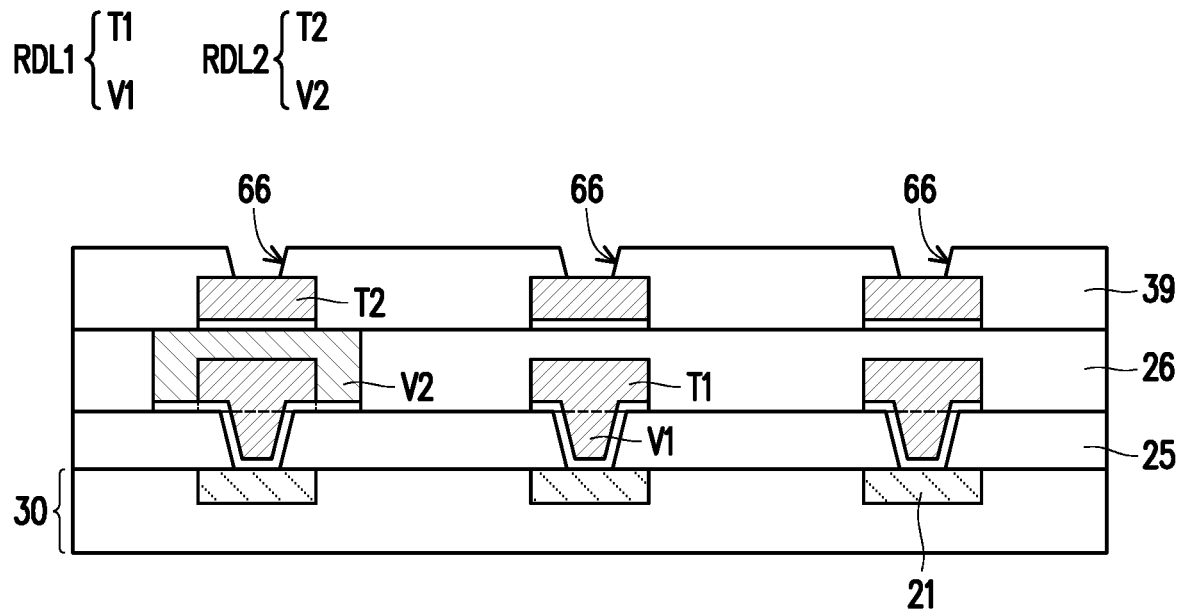
Figure 2N:
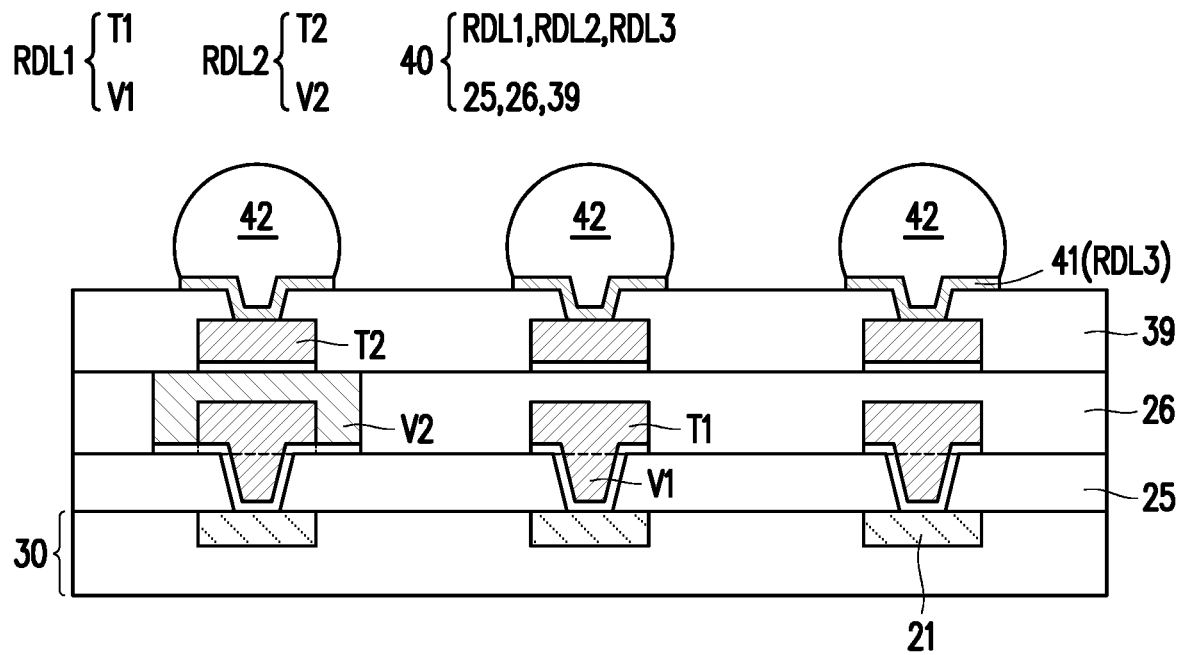
Figure 20:
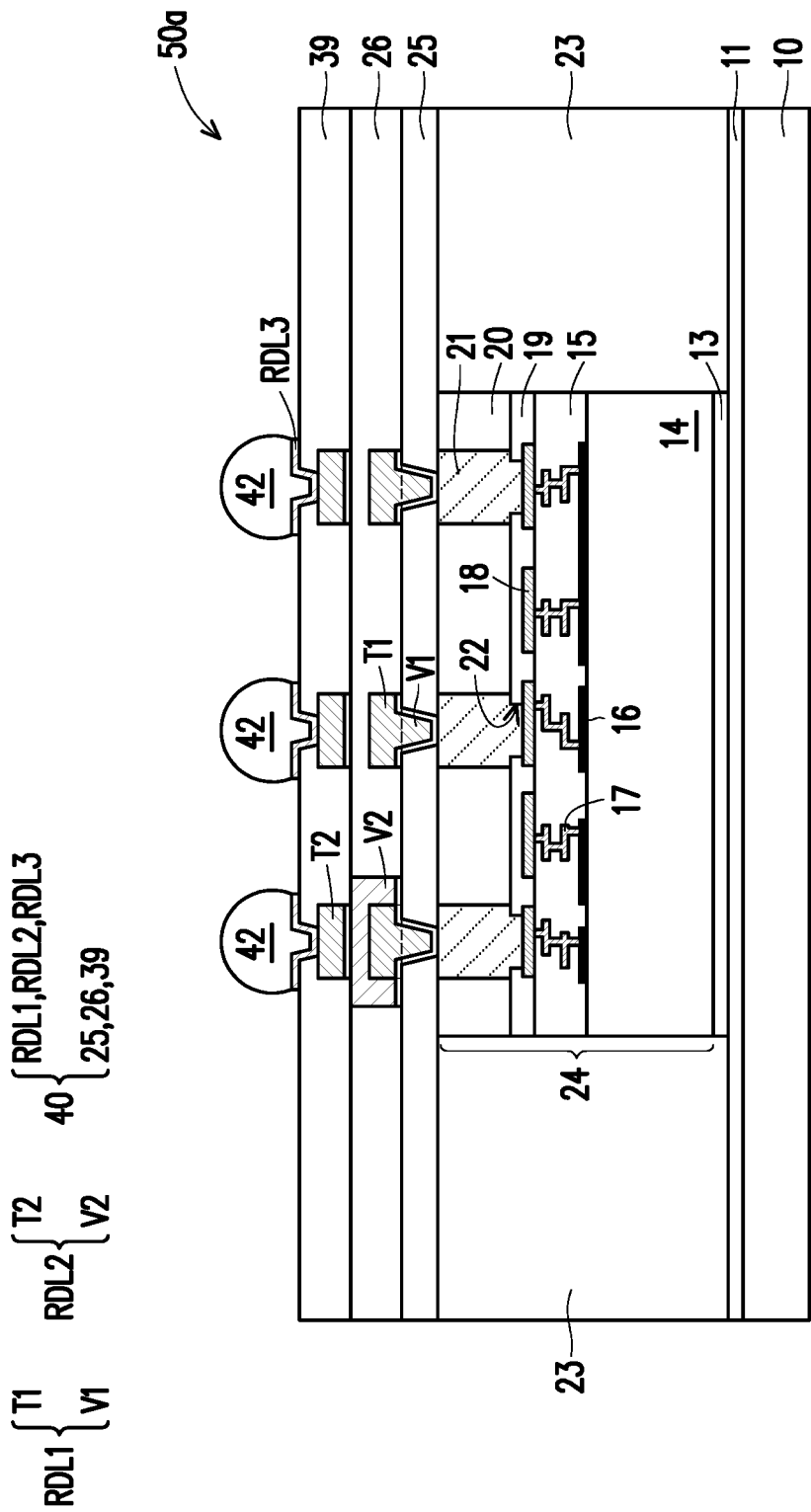
Figure 2P:
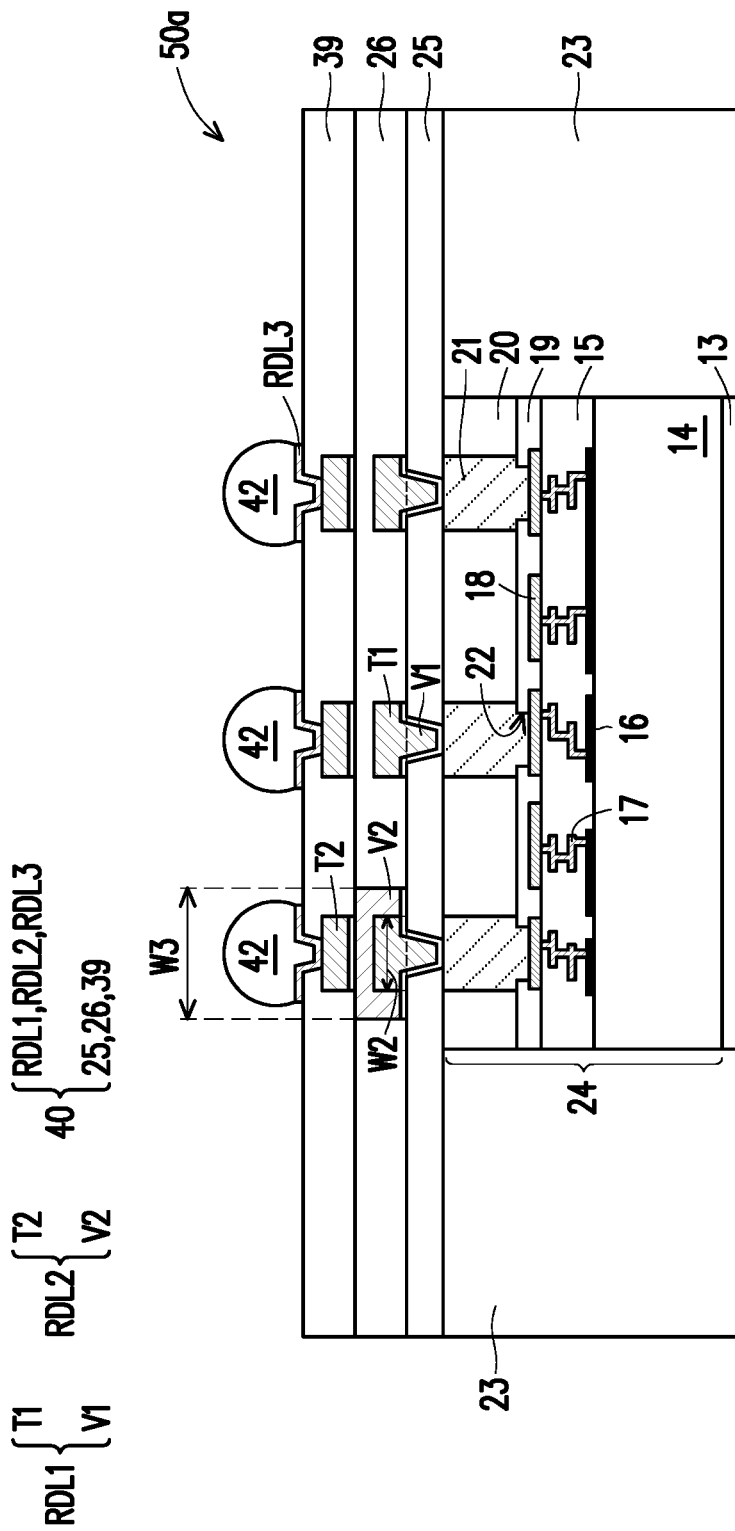

FIG. 2A to FIG. 2P are schematic cross-sectional views illustrating a forming method of a package structure according to a first embodiment. Further, for the sake of brevity, FIG. 2A to FIG. 2N are schematic cross-sectional views illustrating a method of forming a redistribution layer (RDL) structure 40 on the structure 30 according to the first embodiment. The detailed components of the structure 30 of FIG. 1 are not illustrated in detail in FIGS. 2A to 2N, and only the connectors 21 for subsequent packaging processes are shown.

Referring to FIG. 2A, a dielectric layer 25 is formed on the structure 30. In other words, the dielectric layer 25 is formed on the die 24 and the encapsulant 23 shown in FIG. 1. The dielectric layer 25 may be a single layer or a multilayer structure. The material of the dielectric layer 25 includes an inorganic dielectric material, an organic dielectric material, or a combination thereof. The inorganic dielectric material is, for example, silicon oxide, silicon nitride, silicon oxynitride, or a combination thereof. The organic dielectric material includes polymer. In some embodiments, the dielectric layer 25 is a polymer layer. The polymer layer includes a photosensitive material, a non-photosensitive material, or a combination thereof. In some embodiments, the photosensitive material includes PBO, polyimide, BCB, positive photoresist, negative photoresist, a combination thereof, and/or the like. The non-photosensitive material includes Ajinomoto buildup film (ABF). The dielectric layer 25 may be formed by chemical vapor deposition method, a spin coating process and a curing process, or lamination.

Referring to FIG. 2B, the dielectric layer 25 is patterned to form a plurality of via holes 33 in the dielectric layer 25. The via holes 33 penetrate through the dielectric layer 25 to expose portions of the top surfaces of the connectors 21. In some embodiments in which the dielectric layer 25 is a photosensitive polymer material, the patterning method includes exposure and development processes or a laser drilling process. In some other embodiments in which the dielectric layer 25 is an inorganic dielectric material or a non-photosensitive polymer material, the patterning method includes photolithography and etching processes. In some embodiments, the sidewalls of the via hole 33 may be inclined, and the cross-section shape of the via hole 33 may be trapezoid, but the disclosure is not limited thereto. In some other embodiments, the sidewalls of the via hole 33 may be straight, and the cross-section shape of the via hole 33 may be square, rectangle, or the like.

Referring to FIG. 2C, a seed layer 34 (or referred as a seed material layer) is formed on the dielectric layer 25. In some embodiments, the seed layer 34 is a conformal seed layer. That is, the seed layer 34 has a substantially equal thickness extending along the region on which the seed layer 34 is formed. The seed layer 34 is, for example, a copper seed layer or other metal seed layers. The forming method thereof includes physical vapor deposition. The physical vapor deposition is, for example, sputtering. The seed layer 34 covers the top surface of the dielectric layer 25, and is filled in the via holes 33 to cover the bottom surface and sidewalls of the via holes 33. In other words, the seed layer 34 covers the top surface and sidewalls of the dielectric layer 25 and portions of the top surfaces of the connectors 21. In some embodiments, a barrier layer is further formed on the dielectric layer 25 before the seed layer 34 is formed. The material of the barrier layer includes metal, metal nitride, or a combination thereof. The material of the barrier layer is, for example, titanium, titanium nitride, tantalum nitride, or a combination thereof. The method of forming the barrier layer is, for example physical vapor deposition such as sputtering.

Referring to FIG. 2D, a mask layer 60 having a plurality of openings 61 is formed on the seed layer 34. The openings 61 expose the seed layer 34 in the via holes 33 and a portion of the seed layer 34 on the top surface of the dielectric layer 25. In some embodiments, the opening 61 is a trench located over the via hole 33, and is in spatial communication with the via hole 33. The width W2' of the opening 61 is greater than the top width W1' of the via hole 33.

Figure 4:
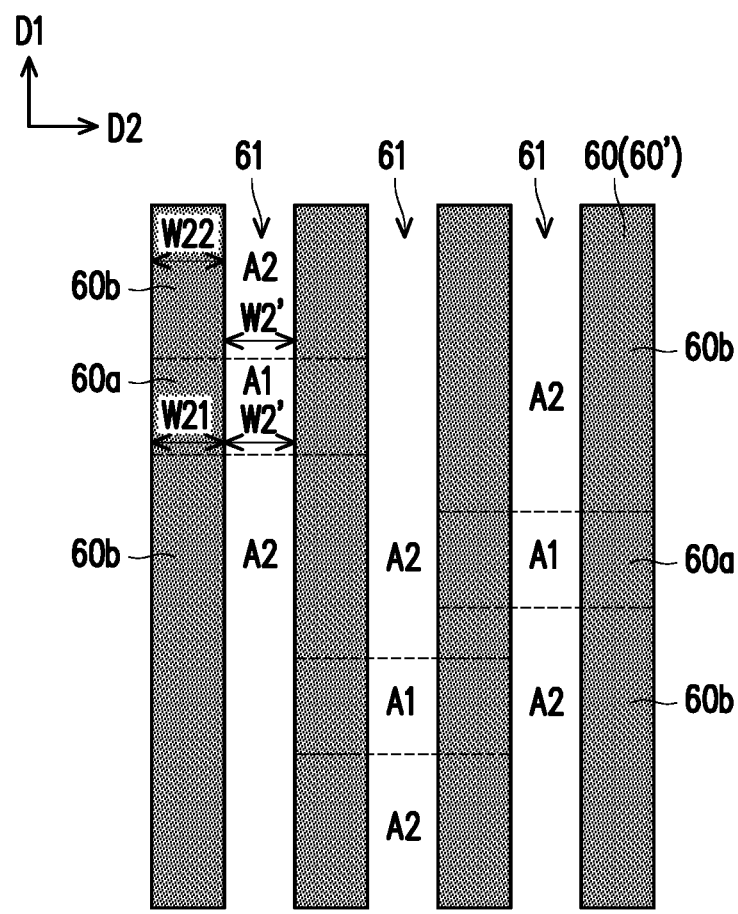
FIG. 4 is a top view of a mask layer according to some embodiments of the disclosure.

Referring to FIG. 2D and FIG. 4, FIG. 4 is a top view of the mask layer 60. In some embodiments, the mask layer 60 includes a plurality of mask patterns 60'. The mask pattern 60' includes a first part 60a and second parts 60b. In some embodiments, the width W21 of the first part 60a is equal to the width W22 of the second part 60b. The sidewall of the first part 60a is substantially coplanar with the sidewall of the second part 60b. The openings 61 of the mask layer 60 are located between the mask patterns 60'. The opening 61 includes a first area A1 and second areas A2 connected to the first area A1. The first area A1 is located between the first parts 60a of the adjacent mask patterns 60'. The second area A2 is located between the second parts 60b of the adjacent mask patterns 60'. In some embodiments, the first area A1 is for a via landing region of a trace to be formed therein, and the second area A2 is for a non-via landing region of a trace to be formed therein in subsequent processes. In some embodiments, the width W2' of the first area A1 is equal to the width W2' of the second area A2.

Referring to FIG. 2E, a conductive layer 35 is formed on the seed layer 34 exposed by the openings 61 by, for instance, an electroplating process. The conductive layer 35 is filled in the via holes 33 and the openings 61, covering the seed layer 34 in the via holes 33 and a portion of the seed layer 34 on the top surface of the dielectric layer 25. The conductive layer 35 includes, for instance, copper or other suitable metals.

Referring to FIG. 2F, thereafter, the mask layer 60 is stripped, and the portion of the seed layer 34 covered by the mask layer PR are exposed. The seed layer 34 includes first parts 34a, second parts 34b and third parts 34c connected to each other. The first part 34a is located in the via hole 33, and covered by the conductive layer 35. The second part 34b and the third part 34c are located on the top surface of the dielectric layer 25. The second part 34b is connected to the first part 34a and the third part 34c, and covered by the conductive layer 35. The third part 34c is connected to the two adjacent second parts 34b, and is not covered by the conductive layer 35, but exposed.

The conductive layer 35 includes first parts 35a and second parts 35b on the first parts 35a. The first part 35a of the conductive layer 35a is located in the via hole 33, and surrounded by the first part 34a of the seed layer 34. The second part 35b of the conductive layer 35 protrudes from the top surface of the dielectric layer 25, covering the second part 34b of the seed layer 34. In some embodiments, the first part 35a of the conductive layer 35 and the first part 34a of the seed layer 34 in the via holes 33 form a plurality of vias V1. The top surfaces of the vias V1 are substantially coplanar with the top surface of the dielectric layer 25. The second part 35b of the conductive layer 35 and the second part 34b of the seed layer 34 form a plurality of traces T1. The traces T1 are located on the vias V1, covering the top surface of the vias V1 and a portion of the top surface of the dielectric layer 25. In other words, the vias V1 are embedded in and penetrating through the dielectric layer 25 to be in electrical contact with the connectors 21. The traces T1 are electrically connected to the connectors 21 through the vias V1.

In some embodiments, the width W2 of the trace T1 is greater than the top width W1 of the via V1. In some embodiments, since the traces T1 and the vias V1 are formed by the same sputtering or/and electroplating processes with the same material, there may be no obvious interface between the traces T1 and the vias V1.

Still referring to FIG. 2F, the vias V1 and the traces T1 form a redistribution layer RDL1. The redistribution layer RDL1 penetrates through the dielectric layer 25 to be in contact with the connectors 21. The redistribution layer (RDL) is a conductive layer over the die 24 that may make the pads 18 of the die 24 available in other locations. After the redistribution layer RDL1 is formed, the third part 34c of the seed layer 34 (that is, the seed layer 34 not covered by the conductive layer 35) is remained to be used in subsequent processes.

Referring to FIG. 2G, a mask layer 62 having an opening 63 is formed on the seed layer 34 and the conductive layer 35. The number of the opening 63 in FIG. 2G is merely for illustration, and the disclosure is not limited thereto. In some embodiments, the opening 63 is a hole, exposing a portion of the trace T1 and a portion of the seed layer 34 adjacent to the trace T1, that is, a portion of the third part 34c of the seed layer 34 is exposed by the opening 63. Thereafter, a conductive layer 37 is formed on the seed layer 34 and the conductive layer 35 exposed by the opening 63 through, for example, an electroplating process. The material and the forming method of the conductive layer 37 may be the same as or different from those of the conductive layer 35. In this embodiment, both the seed layer 34 and the conductive layer 35 may serve as the seed of forming the conductive layer 37 during the electroplating process.

Referring to FIG. 2G, FIG. 2H and FIG. 2I, the mask layer 62 is stripped. A removal process with the conductive layer 37 and the conductive layer 35 as a mask is performed, such that the seed layer 34 not covered by the conductive layer 35 and the conductive layer 37 is removed, that is, a portion of the third part 34c of the seed layer 34 is removed, and a seed layer 34' is remained. The seed layer 34' includes the first part 34a, the second part 34b and a third part 34c'.

Referring to FIG. 2I, the first part 34a and the second part 34b of the seed layer 34, and the conductive layer 35 form the redistribution layer RDL1. The third part 34c' of the seed layer 34' and the conductive layer 37 form a via V2 on the redistribution layer RDL1. That is to say, the via V2 and the redistribution layer RDL1 includes the same seed layer 34'.

Referring to FIG. 2J, a dielectric layer 26 is formed on the dielectric layer 25 and the redistribution layer RDL1, and aside the via V2. The dielectric layer 26 covers the top surface of the dielectric layer 25, the top surfaces of the redistribution layer RDL1, and the sidewalls of the via V2. The top surface of the via V2 is exposed. The material of the dielectric layer 26 may be the same as or different from the material of the dielectric layer 25. In some embodiments, the dielectric layer 26 may be formed by firstly forming a dielectric material layer on the dielectric layer 25, the redistribution layer RDL1 and the via V2. Thereafter, a planarization process such as a chemical mechanical polishing (CMP) process is performed, such that the top surface of the via V2 is exposed. In some embodiments, the top surface of the dielectric layer 26 is substantially coplanar with the top surface of the via V2.

Referring to FIG. 2K, a seed layer 28 is formed on the dielectric layer 26. The material and the forming method of the seed layer 28 may be similar to those of the seed layer 34. The seed layer 28 covers the top surface of the dielectric layer 26 and the top surface of the via V2.

A mask layer 64 having a plurality of openings 65 is then formed on the seed layer 28. In some embodiments, the opening 65 is a trench, exposing a portion of the seed layer 28 on the via V2, and a portion of the seed layer 28 on the dielectric layer 26. A conductive layer 38 is then formed on the seed layer 28 exposed by the openings 65. The material and the forming method of the conductive layer 38 may be similar to those of the conductive layer 35 or 37 described above.

Referring to FIG. 2K and FIG. 2L, the mask layer 64 is stripped. A removal process with the conductive layer 38 as a mask is performed, so as to remove the seed layer 28 not covered by the conductive layer 38, and a seed layer 28a underlying the conductive layer 38 is remained. The removal process includes, for example, an etching process. The conductive layer 38 and the seed layer 28a form a plurality of traces T2. The traces T2 are electrically connected to the traces T1 of the redistribution layer RDL1 through the via V2. The traces T2 and the vias V2 form a redistribution layer RDL2 on the redistribution layer RDL1.

Referring to FIG. 2L, in the redistribution layer RDL2, the conductive layer 38 of the trace T2 and the conductive layer 37 of the via V2 are not formed simultaneously, but formed by different processes. The conductive layer 38 and the conductive layer 37 are not in contact with each other, but are physically separate from each other by the seed layer 28a therebetween. The conductive layer 38 and the conductive layer 37 are electrically connected to each other through the seed layer 28a therebetween. In other words, an interface 80 is existed between the trace T2 and the via V2 of the redistribution layer RDL2. In some embodiments, the interface 80 is substantially coplanar with the top surface of the dielectric layer 26.

Referring to FIG. 2M, a dielectric layer 39 is formed on the redistribution layer RDL2 and the dielectric layer 26. In some embodiments, the dielectric layer 39 is also referred as a passivation layer. The dielectric layer 39 has a plurality of openings 66, exposing a portion of the top surface of the trace T2. The material of the dielectric layer 39 may be the same as or different from those of the dielectric layer 26 and 25. In some embodiments, the dielectric layer 39 may be formed by forming a dielectric material layer on the dielectric layer 26, and then exposure and development processes, photolithography and etching processes, or a laser drilling process is performed to remove a portion of the dielectric material layer on the trace T2.

Referring to FIG. 2M and FIG. 2N, a conductive layer 41 is formed on the traces T2 exposed by the openings 66. The conductive layer 41 is also referred to as an under-ball metallization (UBM) layer for ball mounting. In some embodiments, the conductive layer 41 covers the sidewalls and the bottom surfaces of the openings 66 and extends over the dielectric layer 39 to cover a portion of the top surface of the dielectric layer 39. The material of the conductive layer 41 includes a metal or a metal alloy. The conductive layer 41 is, for example, copper, tin, an alloy thereof, or a combination thereof. The conductive layer 41 is formed by, for instance, physical vapor deposition or electroplating process. In some embodiments, the conductive layer 41 is also referred as a redistribution layer RDL3.

In some embodiments, the dielectric layers 25, 26, 39 and the redistribution layers RDL1, RDL2, RDL3 form a redistribution (RDL) structure 40. In this embodiment, three layers of dielectric layers and three layers of redistribution layers are included in the RDL structure 40. However, the disclosure is not limited thereto. The number of layers of the dielectric layer and the redistribution layer are not limited to what is shown in FIG. 2O.

Thereafter, a plurality of connectors (also referred to as conductive balls or conductive terminals) 42 are placed on the redistribution layer RDL3. The material of the connector 42 includes copper, aluminum, lead-free alloys (e.g., gold, tin, silver, aluminum, or copper alloys) or lead alloys (e.g., lead-tin alloys). In some embodiments, the connectors 42 are placed on the redistribution layer RDL3 by a ball mounting process. The connectors 42 are electrically connected to the connectors 21 through the RDL structure 40.

Referring to FIG. 2O and FIG. 2P, after the connectors 42 are placed on the redistribution layer RDL3, a package structure 50a is thus completed. The package structure 50a is disposed over the carrier 10. In some embodiments, the de-bonding layer 11 is decomposed under the heat of light, and the carrier 10 is then released from the package structure 50a.

Referring to FIG. 2P, the package structure 50a includes the die 24, the encapsulant 23, the RDL structure 40, and the connectors 42. The RDL structure 40 includes the dielectric layers 25, 26, 39 and the redistribution layers RDL1, RDL2, RDL3. The redistribution layer RDL1 includes vias V1 and traces T1. The redistribution layer RDL2 includes vias V2 and traces T2.

Figure 5B:
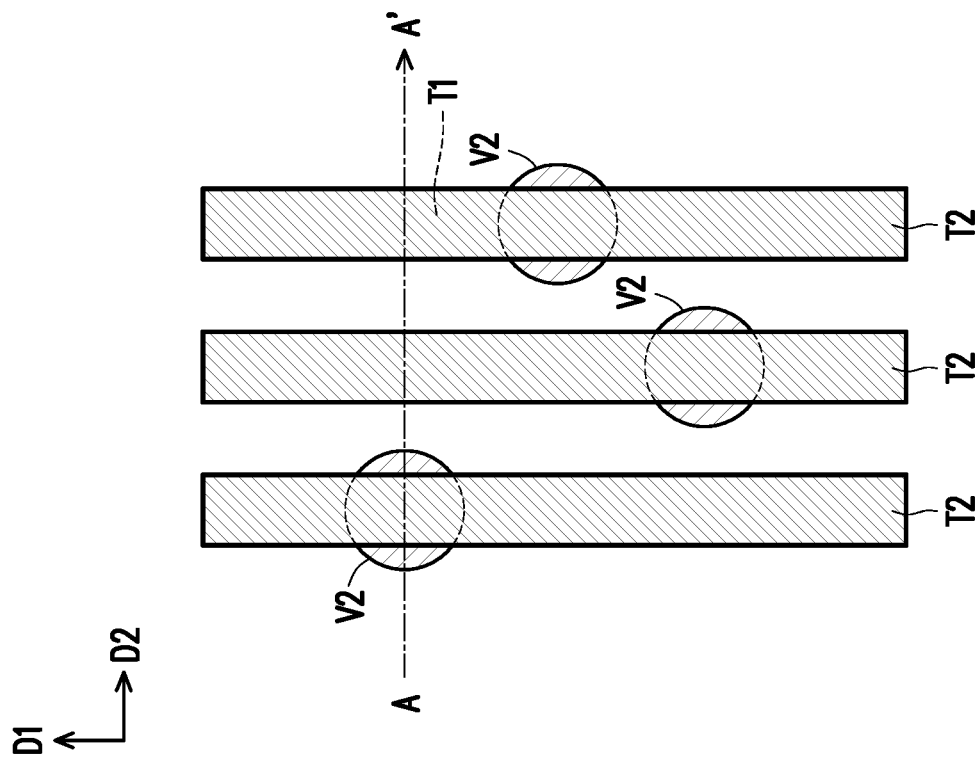
FIG. 5B is a top view of vias and traces of a RDL structure according to some embodiments of the disclosure.
Figure 5A:
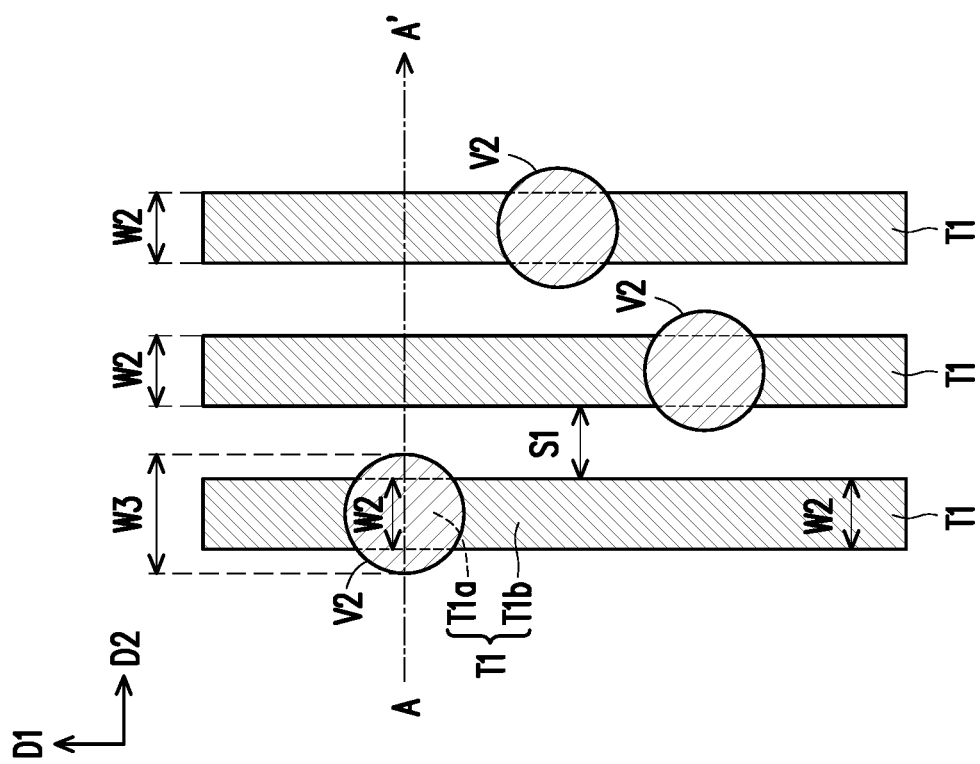
FIG. 5A is a top view of vias and traces of a RDL structure according to the first embodiment of the disclosure.

FIG. 5A is a top view of the via V2 and the trace T1 of FIG. 2P, and the via V2 and the trace T1 of FIG. 2P is the cross-sectional view along the A-A' line of FIG. 5A.

Referring to FIG. 2P and FIG. 5A, in some embodiments, the traces T1 are extending along a first direction D1 and arranged along a second direction D2. In some embodiments, the traces T1 are parallel to each other, but the disclosure is not limited thereto. The widths W2 of the different traces T1 may be the same or different. The space S1 between the adjacent traces T1 may be the same as or different from the width W2 of the trace T1. In some embodiments, the width W2 of the trace T1 ranges from 0.1 μm to 5 μm. The space S1 between the adjacent traces T1 ranges from 0.1 μm to 5 μm.

In some embodiments, the top view of the trace T1 is strip shaped, the cross-section shape of the trace T1 is square, rectangle, or the like. In some embodiments, the trace T1 includes a via landing area T1a for via landing, and non-via landing areas T1b connected to the via landing area T1a. The width W2 of the via landing area T1a is not larger than the width W2 of the non-via landing area T1b. In some embodiments, the width W2 of the via landing area T1a substantially equals to the width W2 of the non-via landing area T1b. In other words, the space (or referred as distance) S1 between the sidewall of the via landing region T1a and the adjacent trace T1 is equal to the space S1 between the sidewall of the non-via landing region T1b and the adjacent trace T1.

Still referring to FIG. 2P and FIG. 5A, in some embodiments, the top view of the via V2 is circle, oval, or the like. The width W3 of the via V2 is larger than the width W2 of the trace T1. In some embodiments, the width W3 ranges from 0.2 μm to 13 μm. It is noted that the width W3 of the via V2 refers to the width of the via V2 along the second direction D2. In some embodiments in which the top view of the via V2 is circle, the width W3 is the diameter of the via V2.

The via V2 is landing on the via landing area T1b of the trace T1 and the dielectric layer 25. The via V2 covers and contacts with the top surface and the sidewalls of the trace T1, and a portion of the top surface of the dielectric layer 25. In some embodiments, the cross-section shape of the via V2 is inverted-U shaped, or the like, for example, and a portion of the trace T1 is located in the opening of the inverted-U shaped via V2. In other words, a portion of the trace T1 is engaged with the via V2. The sidewalls of the via V2 may be straight or inclined. The bottom surface of the via V2 and the bottom surface of the trace T1 are substantially coplanar with each other.

Still referring to FIG. 2P and FIG. 5A, in some embodiments, the vias V2 on adjacent traces T1 are staggered with each other along the second direction D2, but the disclosure is not limited thereto. In some other embodiments, the vias V2 may be aligned with each other along the second direction D2 (not shown).

FIG. 5B is a top view of the traces T2, the vias V2 and the traces T1 of FIG. 2L, and the traces T2, the vias V2 and the traces T1 of FIG. 2L are the cross-sectional view along the A-A' line of FIG. 5B.

Referring to FIG. 2P and FIG. 5B, in some embodiments, the traces T2 and the traces T1 are extending along a same direction. Specifically, both the traces T2 and the traces T1 are extending along the first direction D1, and arranged along the second direction D2. However, the disclosure is not limited thereto. In some other embodiments, the traces T2 and the traces T1 of adjacent redistribution layers RDL1 and RDL2 may be extending along different directions (FIG. 5C).

Figure 5C:
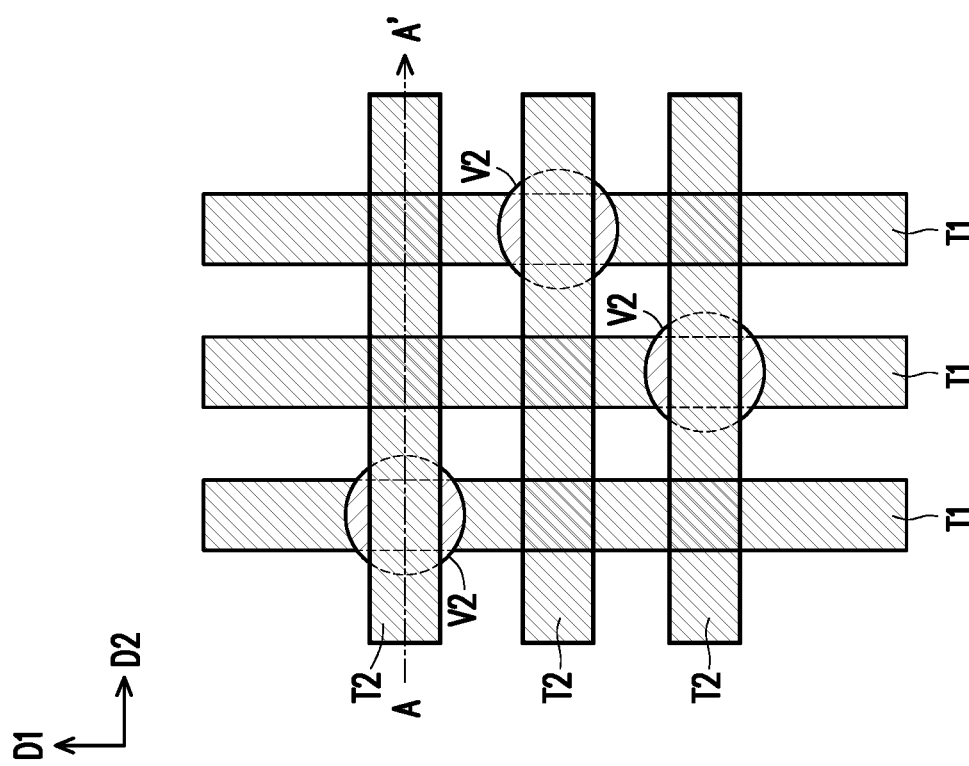
FIG. 5C is a top view of vias and traces of a RDL structure according to some embodiments of the disclosure.

FIG. 5C is a top view of the traces T2, the vias V2 and the traces T1 according to some other embodiments.

Referring to FIG. 5C, the traces T1 and the traces T2 are extending along different directions. In some embodiments, the traces T1 are extending along the first direction D1, and arranged along the second direction D2. The traces T2 are extending along the second direction D2, and arranged along the first direction. The first direction D1 and the second direction D2 are perpendicular to each other, but the disclosure is not limited thereto.

In the first embodiment, the via is formed with a larger width than the trace, a portion of the top surface and a portion of sidewalls of the trace are covered by the via. Therefore, the contact area between the via and the trace is large enough to provide a good contact property and a good conductive property, the trace width is not needed to be widen for via landing. Therefore, the mask pattern for forming the traces may have enough width, and the collapse of the mask pattern is thus avoided. In addition, the problem of high resistance due to slim trace, the problem of adverse ultra fine-space of the trace, and the problem of misalignment when forming the via on the trace are thus avoided.

FIG. 3A to FIG. 3I are schematic cross-sectional views of a method of forming a package structure 50b according to a second embodiment of the disclosure. Further, FIG. 3A to FIG. 3G are schematic cross-sectional views illustrating a method of forming a redistribution layer (RDL) structure 40 on the structure 30 according to the second embodiment. The second embodiment differs from the first embodiment in that vias and traces have the same width.

Figure 3A:
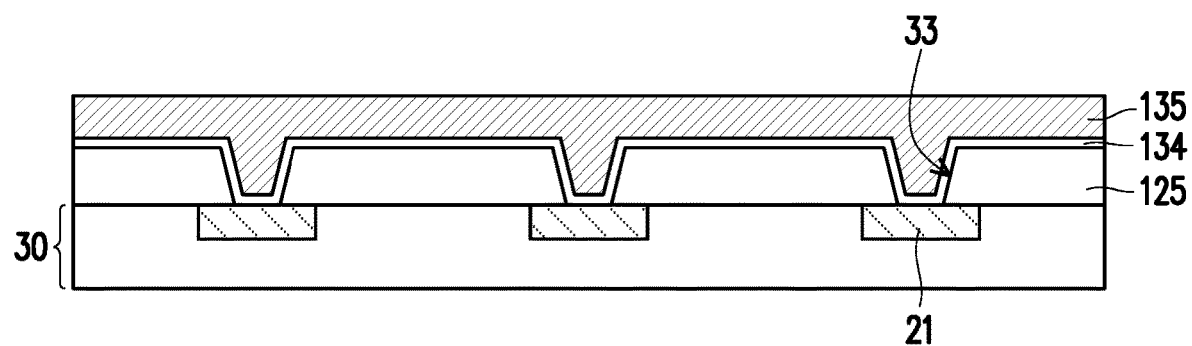
FIG. 3A to FIG. 3I are schematic cross-sectional views illustrating a method of forming a package structure according to a second embodiment of the disclosure.

Referring to FIG. 1 and FIG. 3A, processes similar to those from FIG. 2A to FIG. 2C are performed, such that a dielectric layer 125 having a plurality of via holes 33, and a seed layer 134 are formed on the structure 30. The materials, forming methods and the structural features of the dielectric layer 125 and the seed layer 134 are similar to those of the dielectric layer 25 and the seed layer 34, which is not described again.

Referring to FIG. 3A, a conductive layer 135 (or referred as a conductive material layer) is formed on the seed layer 134 by, for example, an electroplating process. The conductive layer 135 fills into the via hole 33, covering the top surface, the sidewalls and the bottom surfaces of the seed layer 134. The material of the conductive layer 135 is substantially the same as the material of the conductive layer 35 in the first embodiment.

Figure 3B:
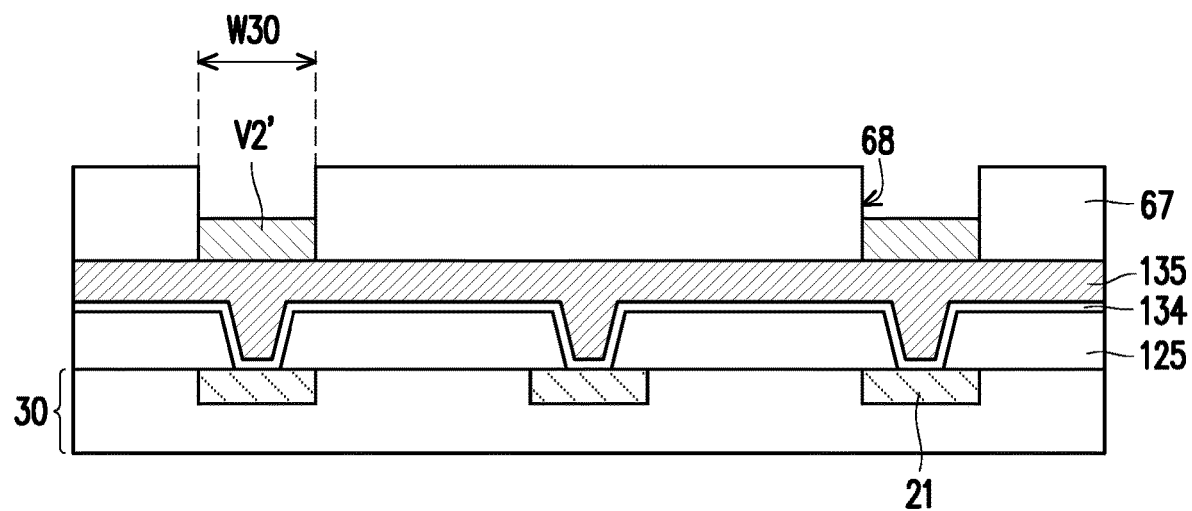

Referring to FIG. 3B, a mask layer 67 having a plurality of openings 68 is formed on the conductive layer 135. In some embodiments, the opening 68 is a hole, exposing a portion of the top surface of the conductive layer 135. In some embodiments, the opening 68 is directly over the via hole 33, but the disclosure is not limited thereto. Thereafter, a plurality of vias V2' are formed on the conductive layer 135 exposed by the openings 68. In some embodiments, the via V2' is a conductive layer, the material of the conductive layer includes copper, or other suitable metals. The material of the via V2' may be the same as or different from the material of the conductive layer 135. The conductive layer may be formed by performing an electroplating process with the conductive layer 135 as the seed. That is to say, no seed layer is included in the via V2'. The width W30 of the via VT ranges from 2 μm to 200 μm, for example.

Figure 3C:
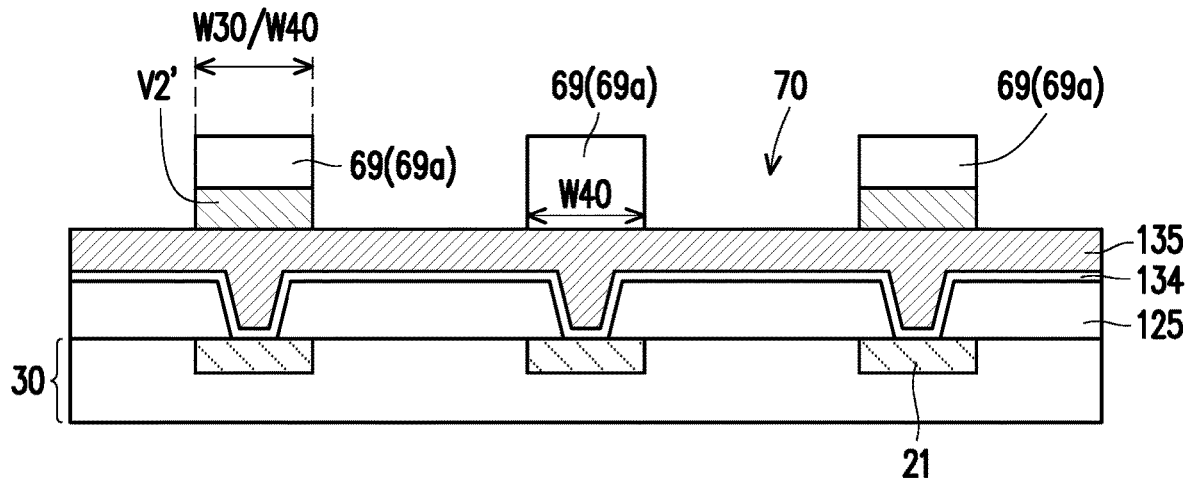

Referring to FIG. 3B and FIG. 3C, the mask layer 67 is stripped. A mask layer 69 is formed on the vias V2' and on the conductive layer 135. In some embodiments, the mask layer 69 includes a plurality of mask patterns 69a and a plurality of openings 70 between the mask patterns 69a. The openings 70 expose a portion of the top surface of the conductive layer 135. A portion of the mask patterns 69a is located on the vias V2, and is not in contact with the conductive layer 135. Another portion of the mask patterns 69a is located on the conductive layer 135. The width W40 of the mask pattern 69a equals to the width W30 of the via V2'. In some embodiments, and the sidewalls of the mask pattern 69a are aligned with the sidewalls of the via V2', but the disclosure is not limited thereto. In some other embodiments, the sidewalls of the mask pattern 69a may be not aligned with the sidewalls of the via V2'. In some embodiments, the structure relationship between the mask patterns 69a is similar to those of the mask patterns 60' as shown in FIG. 4, which is not described again.

Figure 3D:
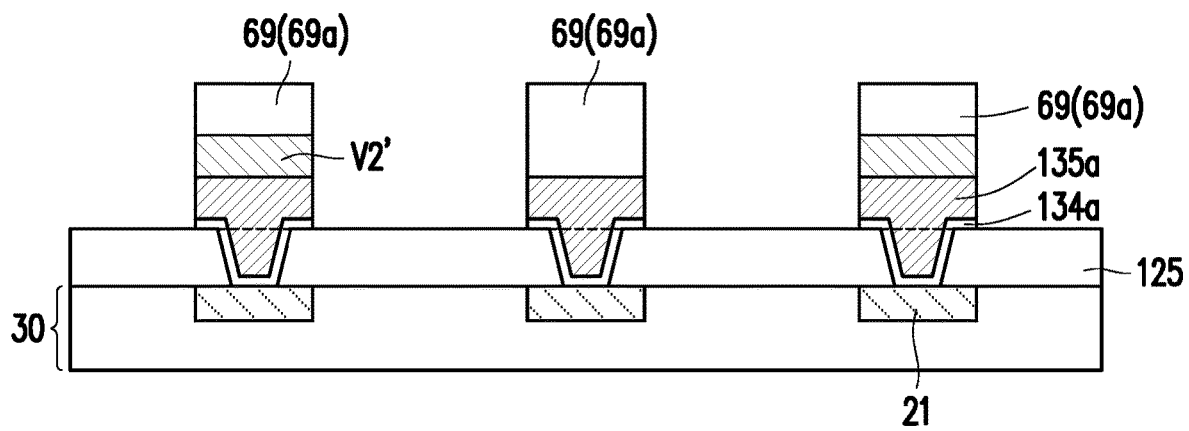

Referring to FIG. 3C and FIG. 3D, a removal process is performed with the mask layer 69 and the underlying via V2' as the mask, so as to remove the conductive layer 135 exposed by the openings 70 of the mask layer 69 and the underlying seed layer 134, and a conductive layer 135a and a seed layer 134a are remained.

Figure 3E:
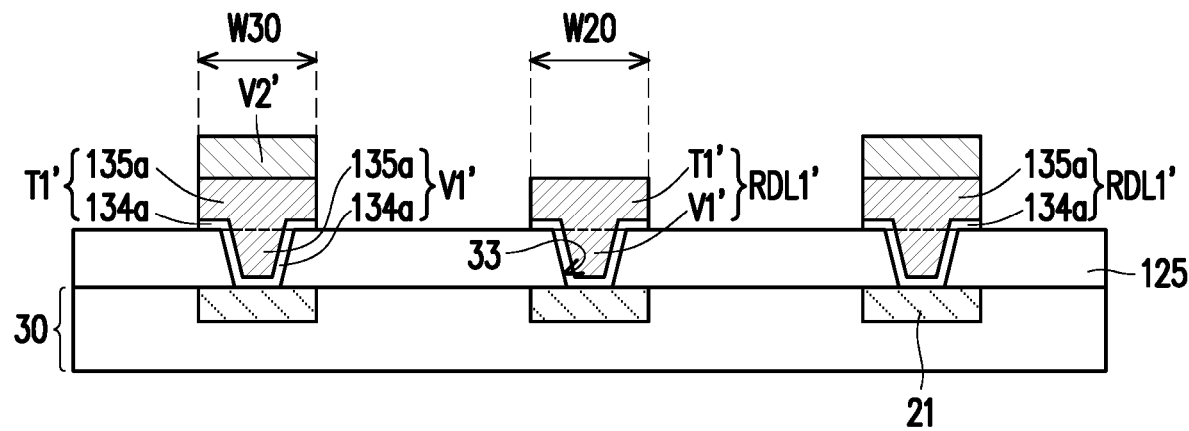

Referring to FIG. 3D and FIG. 3E, the mask layer 69 is stripped. The seed layer 134a and the conductive layer 135a in the via hole 33 form a plurality of vias V1', and the seed layer 134a and the conductive layer 135a on the top surface of the dielectric layer 125 form a plurality of the traces T1'. The vias V1' and the traces T1' on the vias V1' form a redistribution layer RDL1'. That is to say, the redistribution layer RDL1' is formed after the via V2' is formed. The structural of the vias V1' and the traces T1' are substantially the same as those of the vias V1 and traces T1 in the first embodiment. In some embodiments in which the sidewalls of the mask pattern 69a are aligned with the sidewalls of the via V2', the sidewalls of the traces T1 are aligned with the sidewalls of the via V2', the width W30 of the via V2' is equal to the width W20 of the trace T1'. The width W20 of the trace T1' ranges from 2 μm to 200 μm, for example. In some embodiments in which the sidewalls of the mask pattern 69a are not aligned with the sidewalls of the via V2', one sidewall of the trace T1 may be aligned with the sidewall of the via V2'. That is to say, at least one sidewall of the trace T1 is aligned with the sidewall of the via V2'.

Figure 3F:
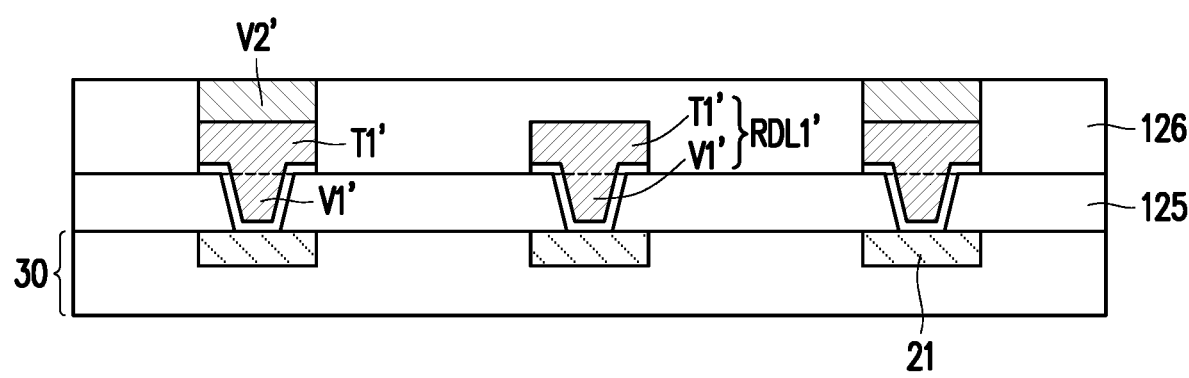

Referring to FIG. 3F, a dielectric layer 126 is formed on the dielectric layer 125 and the traces T1', and aside the vias V2'. The dielectric layer 126 covers the top surface of the dielectric layer 125, the top surfaces and the sidewalls of the traces T1', and the sidewalls of the vias V2'. The material and the forming method of the dielectric layer 126 is similar to those of the dielectric layer 26 in FIG. 2J, and is not described again. In some embodiments, the top surface of the dielectric layer 126 and the top surfaces of the vias V2' are substantially coplanar with each other, but the disclosure is not limited thereto.

Figure 3G:
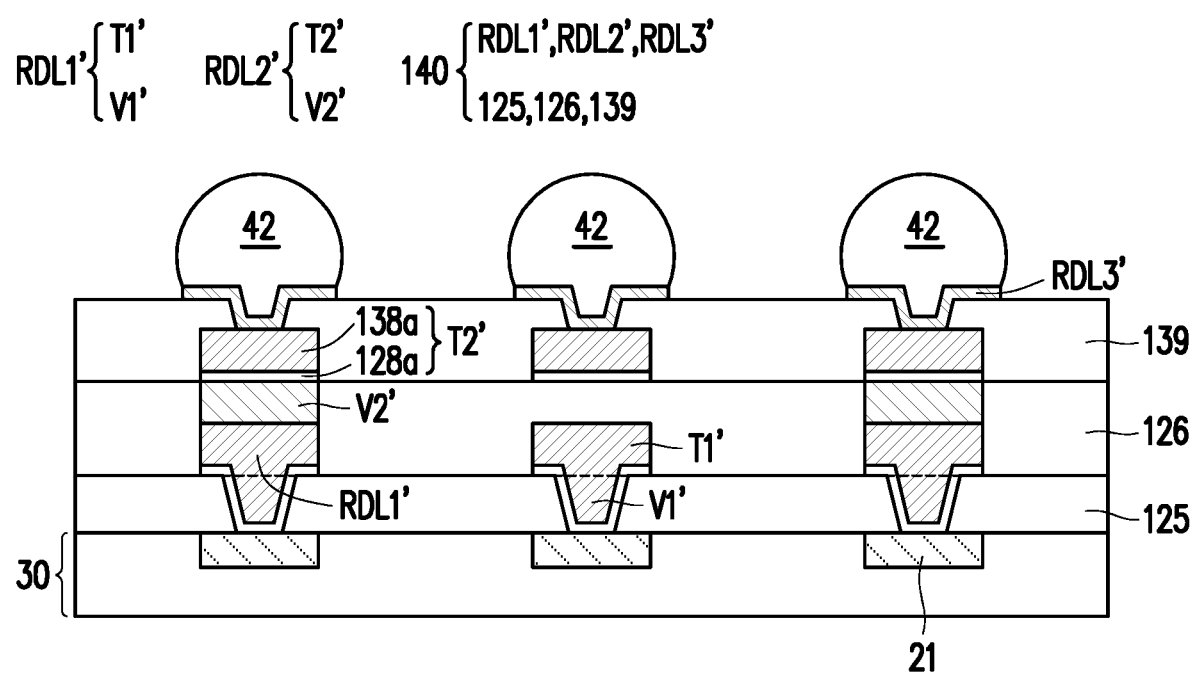

Referring to FIG. 3G, processes similar to those of FIG. 2K to FIG. 2N are performed, a plurality of traces T2' are formed on the dielectric layer 126 and the vias V2'. The traces T2' includes a seed layer 128a and a conductive layer 138a. The traces T2' are electrically connected to the traces T1' through the vias V2'. The vias V2' and the traces T2' form a redistribution layer RDL2'. A dielectric layer 139 is formed on the dielectric layer 126 and the redistribution layer RDL2'. Thereafter, a redistribution layer RDL3' is formed. The redistribution layer RDL3' penetrates through the dielectric layer 139 to electrically connect to the redistribution layer RDL2'. The dielectric layers 125, 126, 139, and the redistribution layers RDL1', RDL2', RDL3' form a RDL structure 140. A plurality of connectors 42 are formed on the redistribution layer RDL3' of the RDL structure 140. The connectors 42 are electrically connected to the connectors 21 through the RDL structure 140.

Figure 3H:
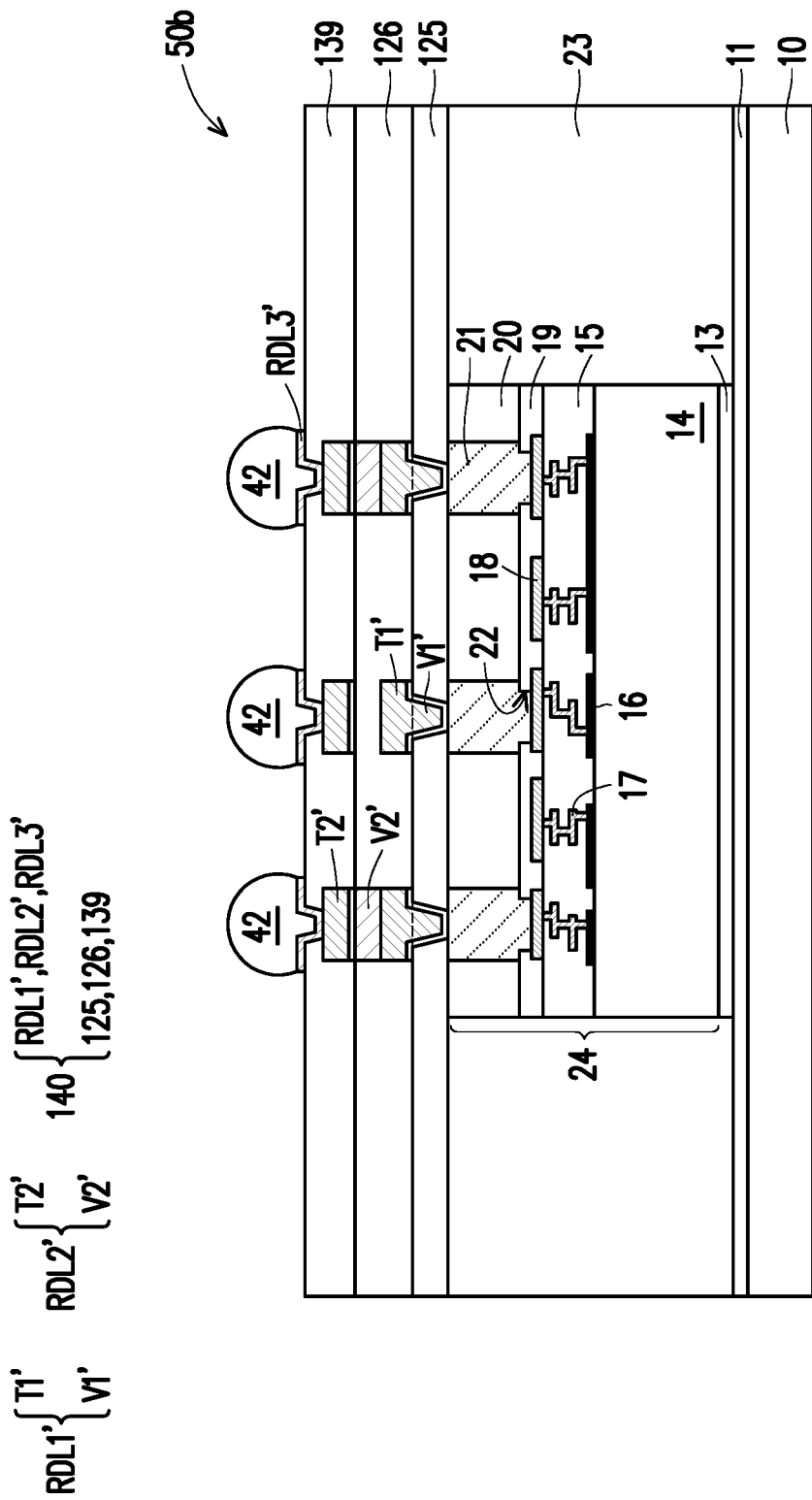
Figure 3I:
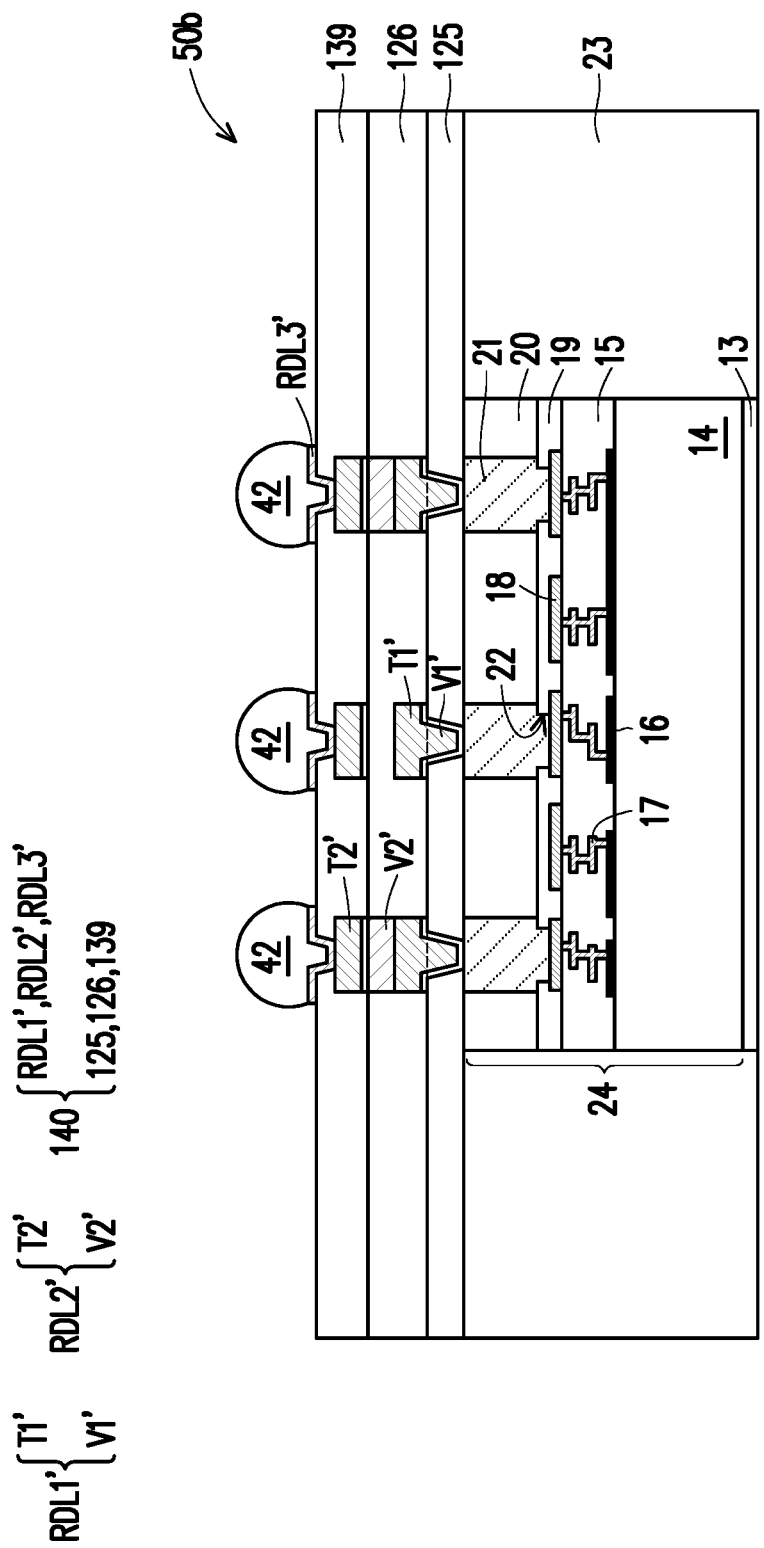

Referring to FIG. 3H and FIG. 3I, after the connectors 42 are formed on the RDL structure 140, a package structure 50b disposed over the carrier 10 is thus completed. In some embodiments, the de-bonding layer 11 is decomposed under the heat of light, and the carrier 10 is then released from the package structure 50b.

Referring to FIG. 3I, the package structure 50b includes the die 24, the encapsulant 23, the RDL structure 140, and the connectors 42. The RDL structure 140 includes the dielectric layers 125, 126, 139 and the redistribution layers RDL1', RDL2', RDL3'. The redistribution layer RDL1' includes vias V1' and traces T1'. The redistribution layer RDL2' includes vias V2' and traces T2'.

Figure 6:
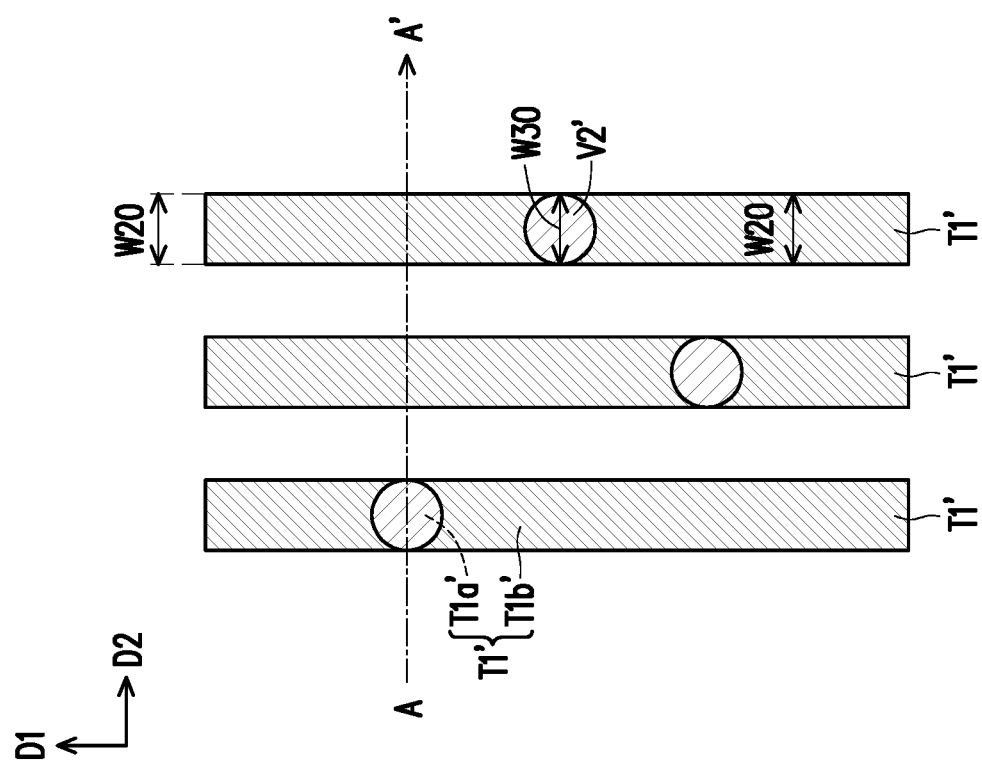
FIG. 6 is a top view of vias and traces of a RDL structure according to the second embodiment of the disclosure.

FIG. 6 is a top view of the via V2' and the trace T1' of FIG. 3I, and the via V2' and the trace T1' of FIG. 3I is the cross-sectional view along the A-A' line of FIG. 6.

Referring to FIG. 3I and FIG. 6, in some embodiments, the traces T1' are extending along a first direction D1 and arranged along a second direction D2. The trace T1' includes a via landing area T1a' for via landing, and non-via landing areas T1b' connected to the via landing area T1a'. In some embodiments, the width W20 of the via landing area T1a' substantially equals to the width W20 of the non-via landing area T1b'. The structural features of the traces T1' are similar to those of the traces T1 as shown in FIG. 2I and FIG. 5A. The trace T1' differ from the trace T1 in that the sidewalls of the trace T1' are not covered by via V2', but are covered by the dielectric layer 125.

Referring to FIG. 3I and FIG. 6, the via V2' is landing on the trace T1', covering a portion of the top surface of the trace T1'. The top view of the via V2' is circle, oval, or the like, for example. In some embodiments, the cross-section shape of the via V2' is square, rectangle, trapezoid, or the like, for example. The sidewalls of the via V2' may be straight or inclined. In some embodiments, the width W30 of the via V2' substantially equals to the width W20 of the via landing area T1a' of the trace T1'. It is noted that the width W30 of the via V2' refers to the width of the via V2' along the second direction D2. In some embodiments in which the top view of the via V2' is circle, the width W30 is the diameter of the via V2'. In some embodiments, the sidewalls of the via V2' are substantially aligned with the sidewalls of the trace T1'.

In the second embodiment, the redistribution layer RDL1' is formed after the via V2' is formed, and via V2' serves as a mask when patterning the redistribution layer RDL1'. Therefore, the trace width is not is not needed to be widen for via landing. Therefore, the mask pattern for forming the traces may have enough width, and the collapse of the mask pattern is thus avoided. In addition, the problem of high resistance due to slim trace, the problem of adverse ultra fine-space of the trace, and the problem of misalignment when forming the via on the trace are thus avoided.

In the foregoing top view FIGS. 4A to 4C and FIG. 7, the vias V2/V2' are not arranged along the same direction as the arrangement direction of the traces T1/T1'. However, the disclosure is not limited thereto.

Figure 7:
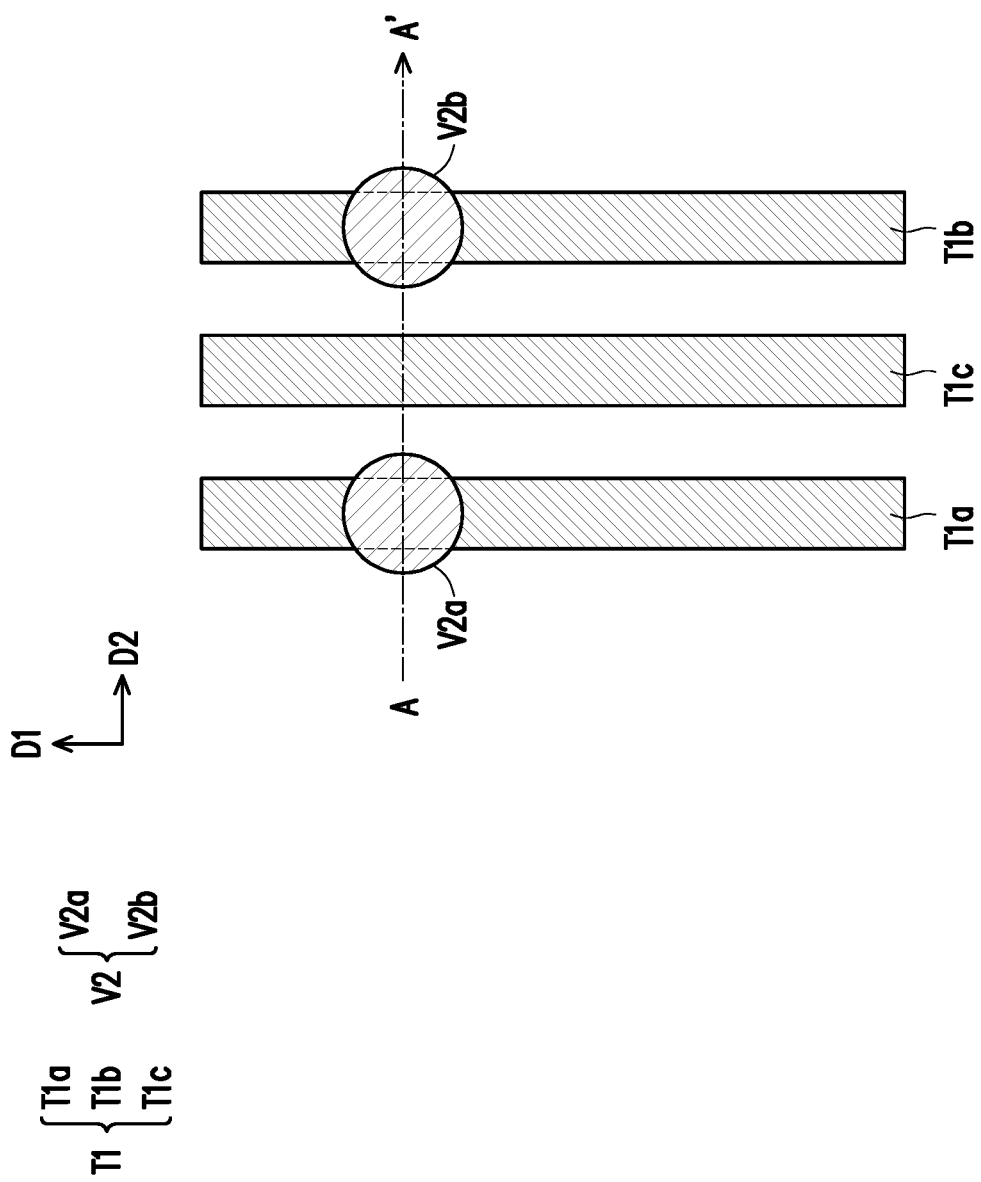
FIG. 7 is a top view of vias and traces of a RDL structure according some embodiments of the disclosure.

FIG. 7 is a top view of vias V2 on traces T1 according to some embodiments. Vias V2 and traces T1 shown in FIG. 7 are formed according to the method described in the first embodiment. It is mentioned that the via V2 and the trace T1 is FIG. 7 may also be formed according to the method described in the second embodiment.

Referring to FIG. 7, in some embodiments, the traces T1 includes a trace T1a, a trace T1b and a trace T1c. The traces T1a, T1b and T1c are located at the same layer of the redistribution layer. The traces T1a, T1b and T1c are extending along the first direction D1 and arranged along the second direction D2. The vias V2 includes a via V2a on the trace T1a, and a via V2b on the trace T1b. The vias V2a and V2b also arranged along the second direction D2. In some embodiments, the trace T1c is laterally located between the trace T1 and the trace T1b. The traces T1a and T1b are signal traces for signal going through. The trace T1c is a ground trace for connecting to ground, so as to avoid the cross-talk between the trace T1a and the trace T1b.

In the embodiments of the disclosure, since the traces have a enough space, signal traces and ground traces are allowed to be disposed at the same redistribution layer, which can eliminate the parasitic capacitance between the adjacent trace or adjacent vias.

Figure 8:
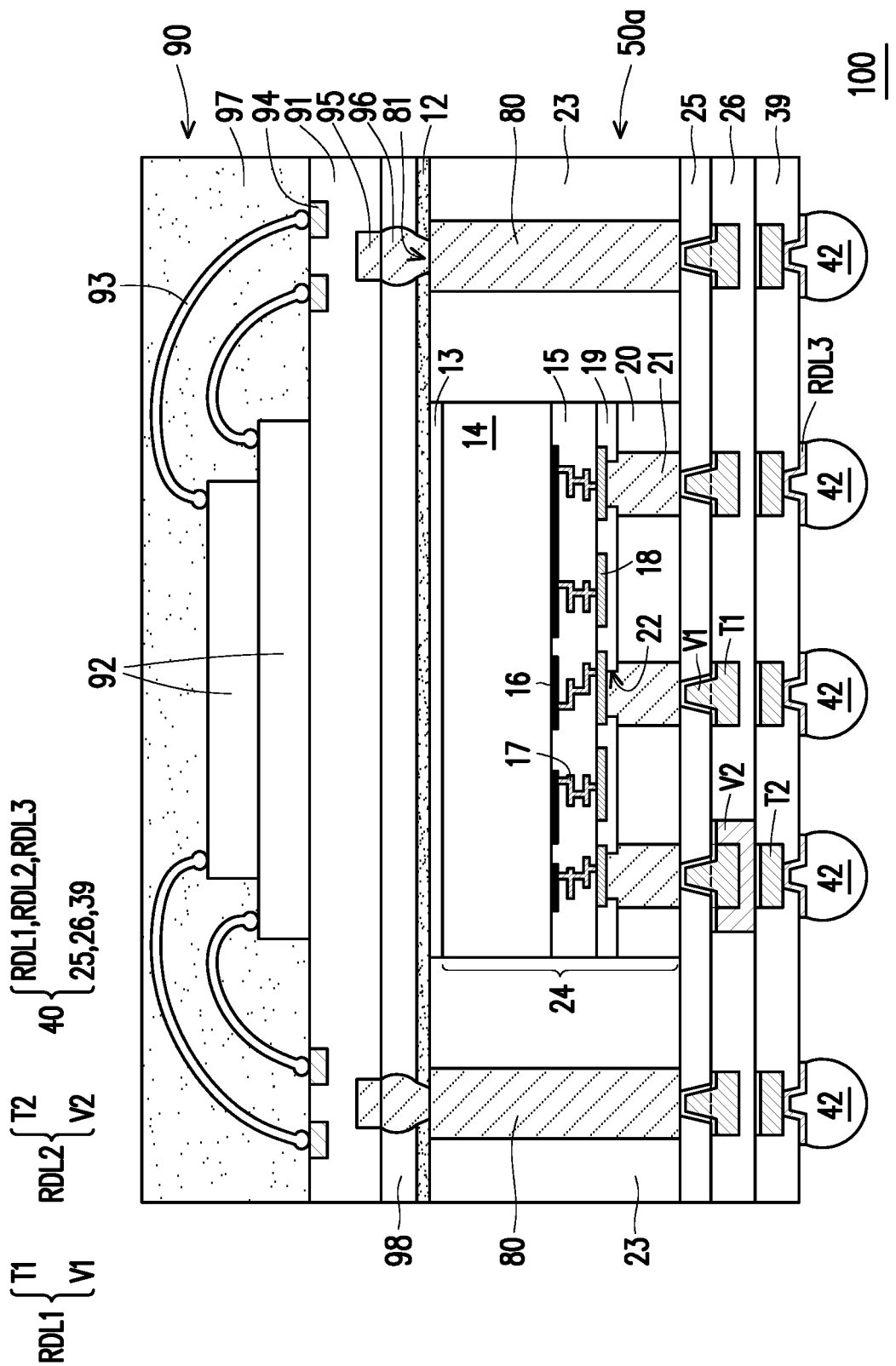
FIG. 8 is a schematic cross-sectional view of a package-on-package (PoP) device according some embodiments of the disclosure.

FIG. 8 is a cross-sectional view of a package on package (PoP) device according to some embodiments of the disclosure. In some embodiments, the package structure 50a or 50b may further connected to other package structure, so as to form a PoP device. For the sake of brevity, the package structure 50a is taken for example.

Referring to FIG. 2P and FIG. 8, in some embodiments, the package structure 50a further comprises a plurality of through integrated fan-out vias (TIVs) 80 aside the die 24. The sidewalls of the TIVs 80 are encapsulated by the encapsulant 23. The TIVs 80 are electrically connected to the RDL structure 40 and the connectors 42. In some embodiments, the package structure 50a further comprises a dielectric layer 12 over the TIVs 80, the encapsulant 23 and the adhesive layer 13.

In some embodiments, the package structure 50a is further connected to a package structure 90 to form a PoP device 100. In some embodiments, the package structure 90 has a substrate 91, and a die 92 is mounted on one surface (e.g. top surface) of the substrate 91. Bonding wires 93 are used to provide electrical connections between the die 92 and pads 94 (such as bonding pads) on the same top surface of the substrate 91. TIVs (not shown) may be used to provide electrical connections between the pads 94 and pads 95 (such as bonding pads) on an opposing surface (e.g. bottom surface) of the substrate 91. Connectors 96 connect the pads 95 and fill in the openings 81 of the dielectric layer 12 to electrically connect to the TIVs 80 of the package structure 50a. An encapsulant 97 is formed over the components to protect the components from the environment and external contaminants. In some embodiments, an underfill layer 98 is formed to fill the space between the package structure 50a and the package structure 90.

In accordance with some embodiments of the disclosure, a package structure includes a die, an encapsulant, a dielectric layer, a first redistribution layer (RDL) and a second RDL. The encapsulant laterally encapsulates the die. The dielectric layer is located on the encapsulant and the die. The first RDL penetrates through the dielectric layer to connect to the die. The second RDL is located on the first RDL and the dielectric layer. The second RDL and the first RDL share a common seed layer.

In accordance with alternative embodiments of the disclosure, a package structure includes a die, an encapsulant, a dielectric layer, a first RDL and a second RDL. The encapsulant encapsulates sidewalls of the die. The dielectric layer is located on the encapsulant and the die. The first RDL penetrates through the dielectric layer to connect to the die. The first RDL includes a first via and a first trace on the first via. The first via and the first trace share a first seed layer and a first conductive layer on the first seed layer. The second RDL is located on the first RDL and includes a second via and a second trace on the second via. An interface is existed between the second via and the second trace.

In accordance with some embodiments of the disclosure, a method of forming a package structure includes: providing a die; forming an encapsulant to encapsulate sidewalls of the die; forming a dielectric layer on the encapsulant and the die; forming a first redistribution layer penetrating through the dielectric layer to connect to the die, the first redistribution layer includes a first via and a first trace on the first via, wherein the first via and the first trace are formed simultaneously; and forming a second redistribution layer to connect to the first redistribution layer, the second redistribution layer includes a second via and a second trace on the second via, wherein the second trace and the second via are formed separately.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
   a die;
   an encapsulant, laterally encapsulating the die;
   a dielectric layer on the encapsulant and the die;
   a first redistribution layer (RDL) penetrating through the dielectric layer to connect to the die; and
   a second RDL on the first RDL and the dielectric layer, wherein the second RDL and the first RDL share a common seed layer,
   wherein a bottom surface of the second RDL is lower than a top surface of the first RDL.

2. The package structure of claim 1, wherein the second RDL comprises a via landing on the first RDL and a trace on the via, and the via of the second RDL share the common seed layer with the first RDL.

3. The package structure of claim 2, wherein the trace is separated from the common seed layer by the via.

4. The package structure of claim 2, wherein the via of the second RDL laterally extends beyond sidewalls of the first RDL.

5. The package structure of claim 1, wherein the first RDL comprises a first conductive layer on and contacting a first portion of the common seed layer, and the second RDL comprises a second conductive layer on and contacting the first conductive layer and a second portion the common seed layer.

6. The package structure of claim 5, wherein the second portion of the common seed layer laterally protrudes from sidewalls of the first conductive layer.

7. The package structure of claim 1, wherein a portion of the second RDL is laterally aside the first RDL and contacts a portion of a sidewall of the first RDL.

8. A package structure, comprising:
   a die;
   an encapsulant, encapsulating sidewalls of the die;
   a dielectric layer on the encapsulant and the die;
   a first RDL penetrating through the dielectric layer to connect to the die, the first RDL comprises a first via and a first trace on the first via, wherein the first via and the first trace share a first seed layer and a first conductive layer on the first seed layer; and
   a second RDL on the first RDL, comprising a second via and a second trace on the second via, wherein the second via comprises a second conductive layer, the second trace comprises a second seed layer and a third conductive layer on the second seed layer, wherein the second seed layer is sandwiched between the second conductive layer and the third conductive layer.

9. The package structure of claim 8, wherein the first conductive layer continuously extending from the first via to the first trace, while the second conductive layer of the second via is separated from the third conductive layer of the second trace.

10. The package structure of claim 8, wherein the second via is inverted-U shaped, and a portion of the first trace is engaged with the second via.

11. The package structure of claim 8, wherein the second via is landing on the first trace and has a sidewall substantially aligned with a sidewall of the first trace.

12. The package structure of claim 8, wherein there is free of seed layer between the second via and the first trace.

13. The package structure of claim 8, wherein a width of the first via is less than a width of the first trace, while a width of the second via is larger than or equal to a width of the second trace.

14. The package structure of claim 8, wherein an interface is existed between the second seed layer of the second trace and the second conductive layer of the second via.

15. A method of forming a package structure, comprising:
    providing a die;
    forming an encapsulant to encapsulate sidewalls of the die;
    forming a dielectric layer on the encapsulant and the die;
    forming a first redistribution layer penetrating through the dielectric layer to connect to the die, the first redistribution layer comprises a first via and a first trace on the first via, wherein the first via and the first trace are formed simultaneously and share a first seed layer and a first conductive layer on the first seed layer; and
    forming a second redistribution layer on the first redistribution layer to connect to the first redistribution layer, the second redistribution layer comprises a second via and a second trace on the second via, wherein the second trace and the second via are formed separately, wherein the second via comprises a second conductive layer, the second trace comprises a second seed layer and a third conductive layer on the second seed layer, wherein the second seed layer is sandwiched between the second conductive layer and the third conductive layer.

16. The method of claim 15, wherein the formation of the first redistribution layer is completed after forming a portion of the second redistribution layer.

17. The method of claim 15, wherein forming the first redistribution layer and the second redistribution layer comprises:
    forming a first seed material layer on the dielectric layer;
    forming the first conductive layer on a portion of the first seed material layer;
    forming the second conductive layer on the first conductive layer and the first seed material layer; and
    patterning the first seed material layer using the second conductive layer as a mask, so as to form the first seed layer, wherein the first conductive layer and a first portion of the first seed layer constitute the first via and the first trace of the first redistribution layer, the second conductive layer and a second portion of the first seed layer constitute the second via of the second redistribution layer; and
    forming the second trace on the second via.

18. The method of claim 17, wherein forming the second conductive layer comprises:
    forming a patterned mask layer over the dielectric layer, the patterned mask layer has an opening exposing portions of the first conductive layer and the first seed material layer;
    forming the second conductive layer on the portions of the first conductive layer and the first seed material layer exposed by the patterned mask layer; and
    removing the patterned mask layer.

19. The method of claim 15, wherein forming the first redistribution layer and the second redistribution layer comprises:
    forming a first seed material layer on the dielectric layer;
    forming a first conductive material layer on the first seed material layer;
    forming the second conductive layer on the first conductive material layer, wherein the second conductive layer serves as the second via of the second redistribution layer;
    forming a patterned mask on the second conductive layer and the first conductive material layer;
    patterning the first conductive material layer and first seed material layer using the patterned mask and the second conductive layer as a mask, so as to form the first conductive layer and the first seed layer constituting the first via and the first trace of the first redistribution layer; and
    forming the second trace on the second via.

20. The method of claim 19, wherein the patterned mask is formed to have sidewalls aligned with sidewalls of the second conductive layer.

\* \* \* \* \*